(12) United States Patent
Yamauchi et al.

(10) Patent No.: US 7,951,727 B2
(45) Date of Patent: May 31, 2011

(54) CAPACITOR FABRICATION METHOD

(75) Inventors: Toshiharu Yamauchi, Kawasaki (JP); Tunenori Yamauchi, Kawasaki (JP); Kumiko Toyota, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/709,670

(22) Filed: Feb. 22, 2010

(65) Prior Publication Data
US 2010/0151654 A1    Jun. 17, 2010

Related U.S. Application Data

(62) Division of application No. 11/150,253, filed on Jun. 13, 2005, now Pat. No. 7,696,107.

(30) Foreign Application Priority Data

Jan. 21, 2005  (JP) ................................. 2005-014016

(51) Int. Cl.
*H01L 21/31* (2006.01)
*H01L 21/469* (2006.01)

(52) U.S. Cl. .................... 438/769; 438/765; 438/775

(58) Field of Classification Search .................. 438/765, 438/769, 775, 791, 907
See application file for complete search history.

(56) References Cited

U.S. PATENT DOCUMENTS

| | | | |
|---|---|---|---|
| 3,058,852 A | 10/1962 | Chiou et al. | |
| 5,032,545 A | 7/1991 | Doan et al. | |
| 5,663,087 A | 9/1997 | Yokozawa | |
| 5,902,561 A | 5/1999 | Carrea et al. | |
| 6,165,916 A | 12/2000 | Muraoka et al. | |
| 6,624,462 B1 * | 9/2003 | Kohara et al. | 257/310 |
| 6,649,538 B1 | 11/2003 | Cheng et al. | |
| 6,943,089 B2 * | 9/2005 | Takasawa et al. | 438/381 |
| 7,316,983 B2 * | 1/2008 | Yamazaki et al. | 438/780 |
| 7,514,376 B2 | 4/2009 | Hori | |
| 2002/0002948 A1 | 1/2002 | Hongo et al. | |

(Continued)

FOREIGN PATENT DOCUMENTS

JP          63-87772 A       4/1988

(Continued)

OTHER PUBLICATIONS

Japanese Office Action mailed Jun. 3, 2008, issued in corresponding Japanese Application No. 2005-014016.

(Continued)

*Primary Examiner* — Phuc T Dang
(74) *Attorney, Agent, or Firm* — Westerman, Hattori, Daniels & Adrian, LLP

(57) ABSTRACT

The nitride film forming method comprises the first step of loading a semiconductor substrate 12 into a reaction furnace, and decompressing the inside of the reaction furnace 14 to remove oxygen and water from the inside of the reaction furnace 14 and the semiconductor substrate 12, the second step of heating the reaction furnace 14 to further remove the oxygen and the water from the reaction furnace 14 and the semiconductor substrate 12, and the third step of purifying nitrogen gas to have the oxygen concentration to be 1 ppb or below, and performing thermal processing with the purified nitrogen gas being fed into the reaction furnace to form a nitride film 56 over the semiconductor substrate 12. The thermal nitriding is performed using an ultrahigh-purity nitrogen gas of an oxygen concentration of 1 ppb or below, whereby nitrogen film of very good quality can be formed without setting the thermal processing temperature very high.

5 Claims, 18 Drawing Sheets

U.S. PATENT DOCUMENTS

| | | |
|---|---|---|
| 2002/0057055 A1 | 5/2002 | Yamazaki et al. |
| 2004/0242021 A1 | 12/2004 | Kraus et al. |
| 2005/0068512 A1* | 3/2005 | Shiraishi .................. 355/67 |

FOREIGN PATENT DOCUMENTS

| | | |
|---|---|---|
| JP | 5-117860 A | 5/1993 |
| JP | 7-94506 A | 4/1995 |
| JP | 2000-91590 A | 3/2000 |
| JP | 2001-274151 A | 10/2001 |
| JP | 2001-284463 A | 10/2001 |
| JP | 2002-158218 A | 5/2002 |
| JP | 2002-184703 A | 6/2002 |
| JP | 2002-217274 A | 8/2002 |
| JP | 2004-200595 A | 7/2004 |
| WO | 2004/097925 A1 | 11/2004 |

OTHER PUBLICATIONS

Japanese Office Action mailed Jun. 23, 2009, issued in corresponding Japanese Application No. 2005-014016.

Samukawa, S, "Advanced Beam Processes for Precise Top-down Patterning", Surface Science, vol. 25, No. 10, pp. 618-627 (2004).

* cited by examiner

CAPACITOR FABRICATION METHOD

CROSS-REFERENCE TO RELATED APPLICATION

This application is a division of U.S. application Ser. No. 11/150,253, filed on Jun. 13, 2005, now U.S. Pat. No. 7,696,107, which is based upon and claims priority of Japanese Patent Application No. 2005-14016, filed on Jan. 21, 2005, the contents being incorporated herein by reference.

BACKGROUND OF THE INVENTION

The present invention relates to a nitride film forming method, a semiconductor device fabrication method, a capacitor fabrication method and a nitride film forming apparatus, more specifically, a nitride film forming method which can form nitride film of good quality, a semiconductor device fabrication method using the nitride film forming method, a capacitor fabrication method and a nitride film forming apparatus to be used in the nitride film forming method.

Conventionally, silicon oxide film has been widely used as a material of the gate insulation film of transistors.

However, silicon oxide film has an about 4.0 dielectric constant which is relatively low and a 10 MV/cm voltage resistance which is not sufficiently high. For further micronization and speed-up of transistors, it is necessary to use a material of high dielectric constant and high voltage resistance as a material of the gate insulation film. When silicon oxide film is used as a material of the gate insulation film, boron implanted in the gate electrodes of transistors often passes through the gate insulation film and arrives at the semiconductor substrate.

Recently, it is noted to use as a material of the gate insulation film silicon nitride film having an about 7.2 dielectric constant, which is relatively high, and a relatively high voltage resistance. The use of silicon nitride film as a material of the gate insulation film can prevent boron in the gate electrodes from arriving at the semiconductor substrate.

When a silicon nitride film is formed on a silicon substrate by thermal nitriding, the thermal processing temperature must be set very high. When the thermal processing temperature is set very high, there is a risk that the semiconductor substrate, etc. may be damaged. Then, the method of forming a silicon oxide film on a silicon substrate and heating the silicon substrate in a nitriding atmosphere to thereby form a silicon nitride film on a part of the silicon oxide film or in the interface between the silicon oxide film and the silicon substrate is proposed. The thus formed film is called a nitride oxide film.

When ammonia gas is used as the nitriding atmosphere, the nitriding takes pace in the silicon oxide film, and the interface between the silicon oxide film and the silicon substrate. When nitrogen monoxide is used as the nitriding atmosphere, the nitriding takes place between the silicon oxide film and the silicon substrate.

A nitriding technique using plasma radicals is also proposed.

Following references disclose the background art of the present invention.
[Non-Patent Reference 1]
Surface Science, Vol. 25, No. 10, p. 618-627 (2004)

However, the nitride film formed by using ammonia gas does not have good microroughness in the surface. When nitrogen monoxide is used, the silicon nitride film is formed only in the interface between the silicon oxide film and the silicon substrate. When the nitride film is formed by using plasma radicals, there is a risk that the semiconductor substrate, etc. may be damaged.

SUMMARY OF THE INVENTION

An object of the present invention is to provide a nitride film forming method which can form nitride film of good quality in a required thickness without damaging the semiconductor substrate, etc., a semiconductor fabrication method and a capacitor fabrication method using the nitride film forming method, and a nitride film forming apparatus used in the nitride film forming method.

According to one aspect of the present invention, there is provided a nitride film forming method comprising: a first step of loading a semiconductor substrate into a reaction furnace and decompressing the inside of the reaction furnace to remove oxygen and water from the inside of the reaction furnace and the semiconductor substrate; a second step of heating the reaction furnace to further remove the oxygen and the water from the inside of the reaction furnace and the semiconductor substrate; and a third step of purifying nitrogen gas to have the oxygen concentration of 1 ppb or below, and performing thermal processing while feeding the purified nitrogen gas into the reaction furnace to form a nitride film over the semiconductor substrate.

According to another aspect of the present invention, there is provided a semiconductor device fabrication method comprising: a first step of loading a semiconductor substrate into a reaction furnace, and decompressing the inside of the reaction furnace to remove oxygen and water from the inside of the reaction furnace and the semiconductor substrate; a second step of heating the reaction furnace to further remove the oxygen and the water from the inside of the reaction furnace and the semiconductor substrate; a third step of purifying nitrogen gas to have the oxygen concentration of 1 ppb or below, and performing thermal processing while feeding the purified nitrogen gas into the reaction furnace to form a gate insulation film of a nitride film over the semiconductor substrate; a fourth step of forming a gate electrode on the gate insulation film; and a fifth step of forming a source/drain diffused layer in the semiconductor substrate on both sides of the gate electrode.

According to further another aspect of the present invention, there is provided a capacitor fabrication method comprising: a first step of forming a lower electrode in or over a semiconductor substrate; a second step of loading the semiconductor substrate into a reaction furnace, and decompressing the inside of the reaction furnace to remove oxygen and water from the inside of the reaction furnace and the semiconductor substrate; a third step of heating the reaction furnace to further remove the oxygen and the water from the inside of the reaction furnace and the semiconductor substrate; a fourth step of purifying nitrogen gas to have the oxygen concentration of 1 ppb or below, and performing thermal processing while feeding the purified nitrogen gas into the reaction furnace to form a capacitor dielectric film of a nitride film over the lower electrode; and a fifth step of forming an upper electrode over the capacitor dielectric film.

According to further another aspect of the present invention, there is provided a nitride film forming apparatus comprising: a gas purifier for purifying nitrogen gas to have the oxygen concentration to be 1 ppb or below; a reaction furnace into which the nitrogen gas purified by the gas purifier is fed, and whose inside wall is nitrided; and a pipe interconnecting the gas purifier and the reaction furnace and having the inside wall nitrided.

According to the present invention, thermal nitriding is performed by using ultrahigh-purity nitrogen gas having an oxygen concentration or a water (moisture) concentration of 1 ppb or below, whereby nitride film of very good quality can be formed without setting the thermal processing temperature very high. Thus, the present invention can provide a semiconductor device, a capacitor, etc. including nitrogen film of very good quality.

DETAILED DESCRIPTION OF THE INVENTION

A First Embodiment

The nitride film forming method and the nitride film forming apparatus according to a first embodiment of the present invention will be explained with reference to FIGS. 1 to 4.

(Nitride Film Forming Apparatus)

Figure 1:
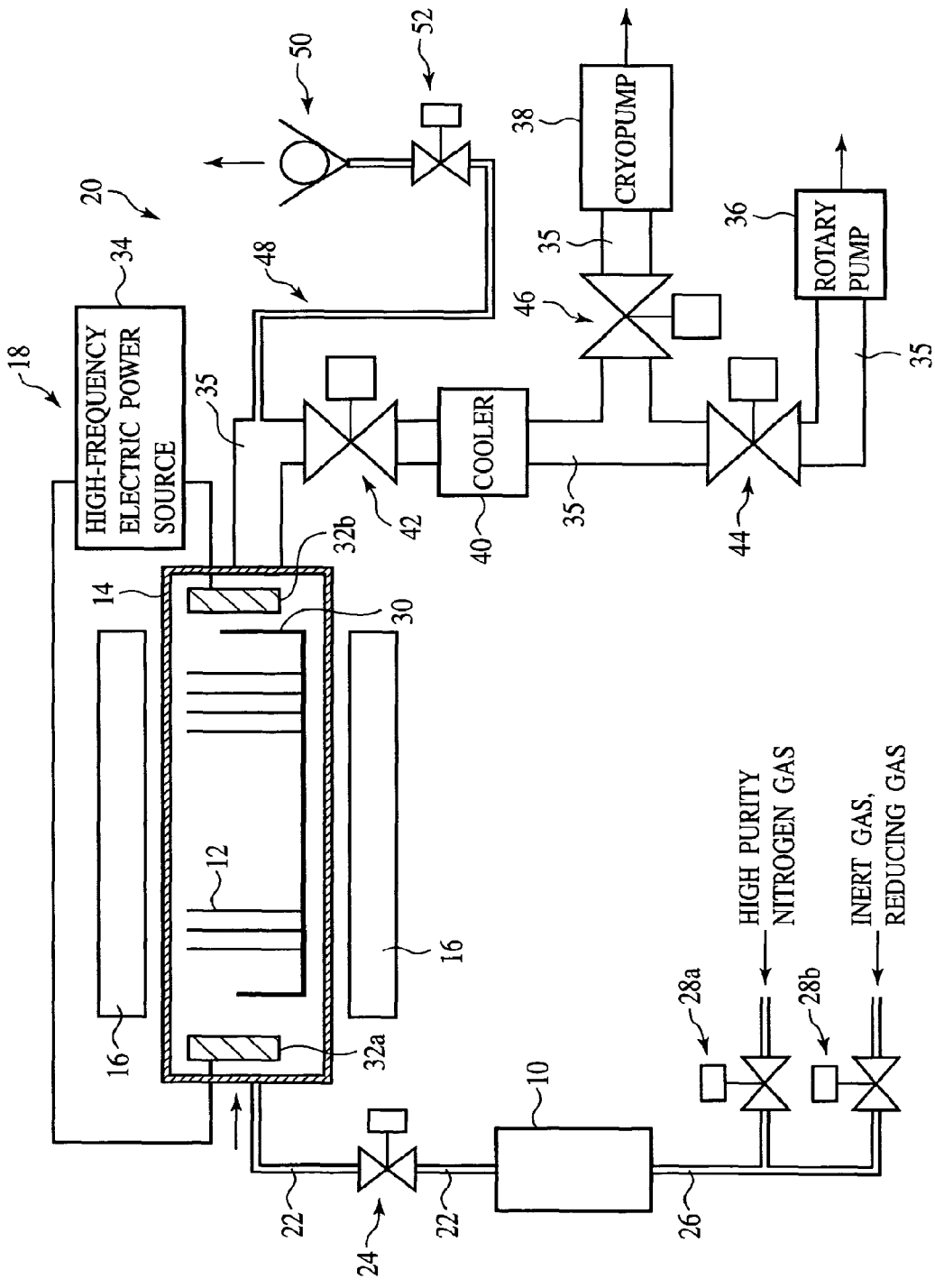
FIG. 1 is a block diagram of the nitride film forming apparatus according to a first embodiment of the present invention.

First, the nitride film forming apparatus according to the present embodiment will be explained with reference to FIG. 1. FIG. 1 is a block diagram of the nitride film forming apparatus according to the present embodiment.

As illustrated in FIG. 1, the nitrogen film forming apparatus according to the present embodiment mainly comprises an ultrahigh-purity gas purifier (gas purifying means) 10 which removes impurities in a gas-to-be-purified to purify the gas of ultrahigh-purity, a reaction furnace (reaction chamber) 14 which thermally processes semiconductor substrate 12, etc., a heater 16 which heats the reaction furnace 14, plasma generating means 18 which make inert gas, reducing gas, etc. into plasma fed into the reaction furnace 14, and exhaust means 20 for discharging gas in the reaction furnace 16.

The ultrahigh-purity gas purifier 10 removes impurities present in a gas-to-be-purified with very high purifying ability to decrease concentrations of the impurities in the gas respectively to 1 ppb or below. Such ultrahigh-purity gas purifier 10 can be an ultrahigh-purity gas purifier for nitrogen gas, e.g., by SAES Pure Gas, Inc. (trade name: MONO TORR). The ultrahigh-purity gas purifier can decrease concentrations of $H_2O$, $O_2$, $H_2$, $CO$, $CO_2$, $CH_4$ respectively to 1 ppb or below.

For example, even when nitrogen gas before purified contains oxygen and water respectively by 1 ppm, concentrations of the oxygen and water in the ultrahigh-purity nitrogen gas purified by the unitrahigh purity gas purifier 10 become respectively 1 ppb or below.

The ultrahigh-purity gas purifier 10 can be used in purifying not only nitrogen gas, but also inert gases, reducing gases and these mixed gases.

The ultrahigh-purity gas purifier 10 and the reaction furnace 14 are interconnected by a pipe 22. The inside wall of the pipe 22 is nitrided. Specifically, a nitride film of an about 0.5-20 μm-thickness is applied to the inside wall of the pipe 22. The inside wall of the pipe 22 is nitrided so as to immobilize materials present on the inside wall of he pipe to thereby prevent the mixing the impurities into ultrahigh-purity nitrogen gas purified by the ultrahigh-purity gas purifier 10. The use of such pipe 22 retains the purities of oxygen and water in the ultrahigh-purity nitrogen gas to be introduced into the reaction furnace 14 to be respectively 1 ppb or below.

A flow rate adjusting valve 24 is provided between the ultrahigh-purity gas purifier 10 and the reaction furnace 14. Also in pipes 26 for introducing a gas-to-be-purified into the ultrahigh-purity gas purifier 10, flow rate adjusting valves 28a, 28b are provided.

The reaction furnace 14 performs thermal processing, etc., on semiconductor substrate 12 to form nitrogen film, etc. on the semiconductor substrates 10.

The reaction furnace 14 is preferably formed of a material containing no oxygen. A material containing no oxygen is used as the material of the reaction furnace 14 for the following reason.

That is, when a material containing oxygen is used as the material of the reaction furnace 14, the oxygen contained in the reaction furnace 14 itself is sublimated into the reaction furnace 14, and the oxygen partial pressure in the reaction furnace 14 is increased. As will be described later, when an oxygen partial pressure in the reaction furnace 14 is lower than an equilibrium oxygen partial pressure, the nitriding advances, but the nitriding does not advance when an oxygen partial pressure in the reaction furnace 14 is higher than an oxygen equilibrium partial pressure. For this reason, it is preferable that the material of the reaction furnace 14 is a material containing no oxygen.

Specifically, the material of the reaction furnace 14 can be SiC (silicon carbide), stainless, inconel, carbon coated with SiC, or others. However, when the reaction furnace 14 is formed of simply of stainless, inconel or others, there is a risk of the metal contamination. When the reaction furnace 14 is formed of stainless, inconel or others, the surface of the reaction furnace 14 is preferably nitrided in advance. Specifically, it is preferable that a nitride film (not illustrated) itself formed on the inside wall of the reaction furnace 14. The inside wall of the reaction furnace 14 is nitrided, whereby the materials present on the inside wall of the reaction furnace 14 can be immobilized, and the metal contamination can be prevented. For example, when thermal processing is performed at 800-1100° C. for 600 minutes with high purity nitrogen gas fed in the reaction furnace 14, an about 5 μm-thickness nitride film can be formed on the inside wall of the reaction furnace 14. The nitride film which is formed as thick as about 0.5 μm has very few pin holes. Accordingly, materials present on the inside wall of the reaction furnace 14 can be immobilized without failure, and the metal contamination can be surely prevented.

The thermal processing for nitriding the inside wall of the reaction furnace 14 may be performed once and does not have to be repeated.

The reaction furnace 14 may be formed of quartz ($SiO_2$) or others. Quartz contains oxygen, but by sufficiently nitriding the inside wall of the reaction furnace 14, nitride film is formed on the inside wall of the reaction furnace 14. With the nitride film on the inside wall of the reaction furnace 14, the mixing of the oxygen into an atmosphere in the reaction furnace 14 can be prevented.

A jig 30, etc. for fixing the semiconductor substrate 12 are disposed in the reaction furnace 12. The jig 30 is formed of a material containing no oxygen for the same reason as described above. Specifically, a material of the jig 30 can be SiC, stainless, inconel, carbon coated with SiC, or others. However, the jig 30 is formed of stainless or inconel, there is a risk that the metal contamination may take place. When the jig 30 is formed of stainless, inconel or others, the surface of the jig 30 is preferably nitrided. Specifically, it is preferable that nitride film (not illustrated) is formed on the surface of the jig 30. The surface of the jig 30 is nitrided, whereby materials present on the surface of the jig 30 can be immobilized, and the metal contamination can be prevented.

The jig 30 may be formed of quartz or others. As described above, quartz contains oxygen. However, sufficient nitriding processing on the surface of the jig 30 can form nitride film on the surface of the jig 30. The nitride film formed on the surface of the jig 30 can prevent the mixing oxygen into an atmosphere in the reaction furnace 14.

A heater 16 is disposed around the reaction furnace 14. The heater 16 is for heating the reaction furnace 14.

A pair of plate electrodes 32a, 32b is disposed in the reaction furnace 14. The plate electrodes 32a, 32b are connected to a high-frequency electric power source 34. The pair of plate electrodes 32a, 32b, and the high-frequency electric power source 34 constitute plasma generating means 18. The plasma generating means 18 applies high-frequency electric power between the plate electrodes 32a, 32b of the pair by the high-frequency electric power source 34 to make an inert gas, a reducing gas or others into plasma which fed into the reaction furnace 14.

A rotary pump 36 and a cryopump 38 are connected to the reaction furnace 14 through a pipe 35. The rotary pump 36 discharges gas from the reaction furnace 14 to some degrees of vacuum of the interior of the reaction furnace 14. The cryopump 38 further increases a degree of vacuum in the reaction furnace 14.

A cooler 40 is provided between the reaction furnace 14 and the rotary pump 36 so as to cool the gas discharged from the reaction furnace 14. The cooler 40 in advance cools a gas to be fed to the cryopump 38.

An exhaust valve 42 is provided between the reaction furnace 14 and the cooler 40. An exhaust valve 44 is provided also between the cooler 40 and the rotary pump 36. An exhaust valve 46 is inserted also between the cooler 40 and the cryopump 38.

A check valve 50 is connected to the pipe 35 through a pipe 48. The check valve 50 discharges gas in the reaction furnace 14 so as to pressurize the interior of the reaction furnace 14 or establish the atmospheric pressured inside the reaction furnace 14. An exhaust valve 52 is inserted between the reaction furnace 14 and the check valve 50.

Thus, the nitride film forming apparatus according to the present embodiment is constituted.

The nitride film forming apparatus according to the present embodiment is characterized mainly in that the ultrahigh-purity gas purifier 10 which decreases impurities concentrations in the nitrogen gas to be introduced into the reaction furnace 14 to 1 ppb or below is provided.

According to the present embodiment, nitride film is formed by thermal nitriding using ultrahigh-purity nitrogen gas having oxygen and water concentrations of 1 ppb or below, which makes it possible to form nitride film of good quality without setting the thermal processing temperature very high.

The nitride film forming apparatus according to the present embodiment is also characterized mainly in that the inside wall of the reaction furnace 14, the inside wall of the pipe 22 and the surface of the jig 30 are nitrided or subjected to other processing.

According to the present embodiment, the inside wall of the reaction furnace 14, the inside wall of the pipe 22 and the surface of the jig 30 are nitrided or subjected to other processing, whereby the mixing of oxygen and water into the ultrahigh-purity nitriding gas which has been purified can be prevented. Thus, according to the present embodiment, nitride film of good quality can be formed without setting the thermal processing temperature very high.

(Nitride Film Forming Method)

Figure 2A:
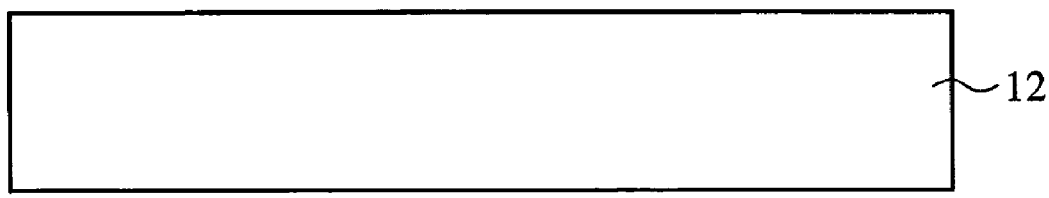
FIGS. 2A to 2C are sectional views in the steps of the nitride film forming method according to the first embodiment.

Next, the nitride film forming method according to the present embodiment will be explained with reference to FIGS. 2A to 3. FIGS. 2A to 2C are sectional views in the steps of the nitride forming method according to the present embodiment, which illustrate the method.

First, as illustrated in FIG. 2A, a semiconductor substrate 12 is prepared. The semiconductor substrate 12 is, e.g., a silicon substrate.

Figure 2B:
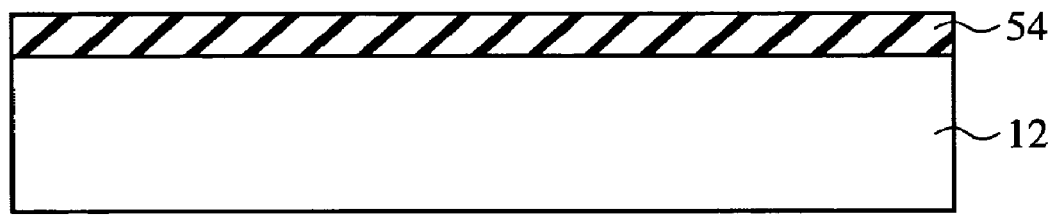

Next, as illustrated in FIG. 2B, an oxide film 54 is formed on the surface of the semiconductor substrate 12 by thermal oxidation. To form the oxide film 54 on the semiconductor substrate 12, another reaction furnace which is not the reaction furnace 14 in FIG. 1 is used to form the oxide film 54. The oxide film 54 is formed in another reaction furnace which is not the reaction furnace 14 in FIG. 1 so as to prevent oxides from staying on the inside wall of the reaction furnace 14. The film thickness of the oxide film 54 is, e.g., 10 nm. When the semiconductor substrate 12 is a silicon substrate, the silicon oxide film 54 is formed on the silicon substrate 12.

Then, the semiconductor substrate 12 is fed into the reaction furnace 14 of the nitride film forming apparatus illustrated in FIG. 1.

Then, with a high purity inert gas being fed into the reaction furnace 14, the inside of the reaction furnace 14 is decompressed to, e.g., 66.5 Pa. The high purity inert gas can be produced by purifying an inert gas by the ultrahigh-purity gas purifier 10. A high purity inert gas to be fed into the reaction furnace 14 is, e.g., high purity argon gas. The inert gas is not essentially argon gas and can be another inert gas. The flow rate of the high purity inert gas fed into the reaction furnace 14 is, e.g., 50 cc/min. The concentrations of oxygen and water in the high purity inert gas to be fed into the reaction furnace 14 are 1 ppb or below. When argon gas is purified by the ultrahigh-purity gas purifier 10, it is possible to decrease the concentration of oxygen and water in argon gas to 1 ppb or below. The temperature inside reaction furnace 14 at the time of decompressing the inside of the reaction furnace 14 is, e.g., 900° C. Thus, the water and oxygen present in the reaction furnace 14, and the water, oxygen, etc. contained in the semiconductor substrate 12 can be removed.

Next, while the temperature inside the reaction furnace 14 is being raised to, e.g., 1000° C., the high purity inert gas is fed into the reaction furnace 14. The high purity inert gas can be produced by purifying an inert gas by the ultrahigh-purity gas purifier 10. A high purity inert gas to be fed into the reaction furnace is, e.g., high purity argon gas. The inert gas is not essentially argon gas and can be another inert gas. The pressure inside the reaction furnace 14 at the time when the temperature inside the reaction furnace 14 is raised is, e.g., 100 kPa. The flow rate of the high purity inert gas to be fed into the reaction furnace 14 is, e.g., 50 cc/min. The concentrations of the oxygen and water in the high purity inert gas to be fed into the reaction furnace 14 are 1 ppb or below. Thus, the water, oxygen, etc. present in the reaction furnace 14, and the water, oxygen, etc. contained in the semiconductor substrate 12 are further removed.

The temperature inside the reaction furnace 14 is set on increase here while the high purity inert gas is being fed into the reaction furnace 14. However, the high purity inert gas maybe fed into the reaction furnace 14 after the temperature inside reaction furnace 14 has been raised to a prescribed temperature.

Then, a high purity inert gas is fed into the reaction furnace 14 with the pressure inside the reaction furnace 14 set at, e.g., 100 kPa and the temperature inside reaction furnace set, e.g., 1000° C., whereby the oxide film 54 on the semiconductor substrate 12 is modified. The high purity inert gas is, e.g., high purity argon gas. The flow rate of the high purity inert gas fed into the reaction furnace 14 is, e.g., 50 cc/min. The oxygen and water concentrations in the high purity inert gas to be fed into the reaction furnace 14 are 1 ppb or below. The oxide film 54 is modified so that the oxide film 54 can be easily nitrided in a later step.

The high purity inert gas may be made into plasma by applying high-frequency electric power between the plate electrodes 32a, 32b when the oxide film 54 is modified. The use of high purity inert gas made into plasma can more surely modify the oxide film 54. Then, the feed of the high purity inert gas into the reaction furnace 14 is stopped.

Then, with the inside of the reaction furnace 14 set at a prescribed thermal processing temperature, ultrahigh-purity nitrogen gas is fed into the reaction furnace 14 to nitride the oxide film 54. Conditions for nitriding the oxide film 54 are as exemplified below. The oxygen and water concentrations in the ultrahigh-purity nitrogen gas are 1 ppb or below. The thermal processing temperature is, e.g., 1000° C. When the thermal processing temperature is set some higher, the nitriding rate is higher, and the nitriding rate is lower when the thermal processing temperature is set some lower. The thermal processing temperature is suitably set, whereby the film thickness of the nitride film 56 can be controlled. The pressure inside the reaction furnace 14 is, e.g., 100 kPa. When the pressure inside the reaction furnace 14 is set some higher, the nitriding rate is higher, and the nitriding rate is lower when the pressure inside the reaction furnace 14 is set some lower. The film thickness of the nitride film 56 can be controlled also by suitably setting the pressure inside the reaction furnace 14. The flow rate of the ultrahigh-purity nitrogen gas is, e.g., 50 cc/min. The thermal processing period of time is, e.g., 60 minutes. When the thermal processing period of time is set some longer, the film thickness of the nitride film 56 is larger, and the film thickness of the nitride film 56 is smaller when the thermal processing period of time is set some shorter. The film thickness of the nitride film 56 can be controlled also by suitably setting the thermal processing period of time.

Figure 3:
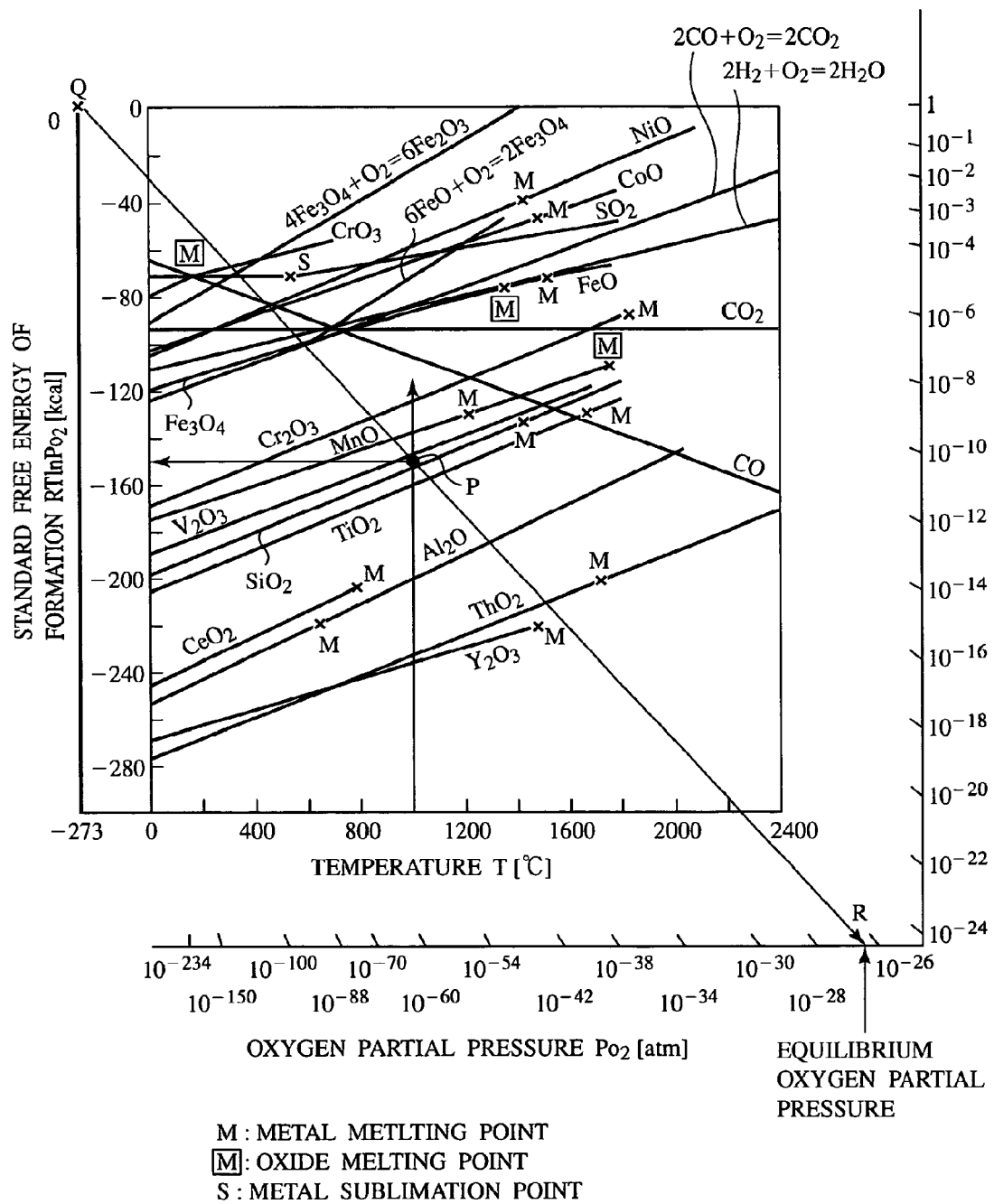
FIG. 3 is a view of the Ellingham Diagram.

The thermal processing temperature for nitriding the oxide film 54 may be set with reference to the Ellingham Diagram as illustrated in FIG. 3.

The Ellingham diagram illustrated in FIG. 3 shows the relationships between the standard free energy of formation (standard Gibbs free energy of formation) of various oxides and the temperature, and the computed equilibrium oxygen partial pressures corresponding to the relationships. The temperatures are taken on the horizontal axis, and the standard free energy of formation ($G=RT\ln P_{O2}$) are taken on the vertical axis. The marks on the outside indicate oxygen partial pressures $P_{O2}$.

The equilibrium oxygen partial pressure means an oxygen partial pressure at a critical point where the dissolution of an oxide takes place or not.

Point P indicates a standard free energy of formation of $SiO_2$ at a certain temperature. For example, the standard free energy of formation of $SiO_2$ at the temperature of 1000° C. is about −150 kcal.

Point Q indicates the standard free energy of formation of $SiO_2$ at absolute zero point. Intersection R between the extended line of the line interconnecting Point Q and Point P, and the line with the marks indicating the oxygen partial pressures $P_{O2}$ indicates the equilibrium oxygen partial pressure of $SiO_2$ at 1000° C. As seen in FIG. 3, the equilibrium oxygen partial pressure at 1000° C. is about $1\times10^{-26}$ atm.

The reaction model for the case that the oxygen partial pressure $P_{O2}$ inside the reaction furnace 14 is above the equilibrium oxygen partial pressure, i.e., $$P_{O2} \geq 1\times10^{-26} \text{ atm}$$

is as follows:

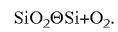

In this reaction model, the dissociation does no take place, and the nitriding of the $SiO_2$ film does not advance.

On the other hand, the reaction model for the case that the oxygen partial pressure $P_{O2}$ inside the reaction furnace is below the equilibrium oxygen partial pressure, i.e., $$P_{O2} < 1\times10^{-26} \text{ atm,}$$

is as follows:

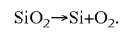

In this reaction model, the dissociation takes place in the SiO$_2$, and the nitriding of the SiO$_2$ film advances.

Thus, when the thermal processing is performed under conditions which make the oxygen partial pressure P$_{O2}$ inside the reaction furnace 14 smaller than the equilibrium oxygen partial pressure, an oxide film is nitrided, and a nitride film can be formed.

As seen in FIG. 3, as the thermal processing temperature is higher, the equilibrium oxygen partial pressure is higher, and as the thermal processing temperature is lower, the equilibrium oxygen partial pressure is lower. Accordingly, the thermal processing temperature is set some higher, whereby the oxide film 54 can be nitrided even when the oxygen partial pressure inside the reaction furnace 14 is relatively high. In other words, when the oxygen partial pressure inside the reaction furnace 14 becomes relatively high, the thermal processing temperature is set some higher, and the oxide film 54 can be nitrided. On the other hand, when the thermal processing temperature is set some lower, the oxide film 54 cannot be nitrided unless the oxygen partial pressure inside the reaction furnace 14 is relatively low. In other words, when the oxygen partial pressure inside the reaction furnace 14 is sufficiently low, the oxide film 54 can be nitrided even when the thermal processing temperature is set relatively low.

As described above, the thermal processing temperature for nitriding the oxide film 54 can be suitably set so that the oxygen partial pressure P$_{O2}$ inside the reaction furnace 14 is lower than the equilibrium oxygen partial pressure.

Figure 2C:
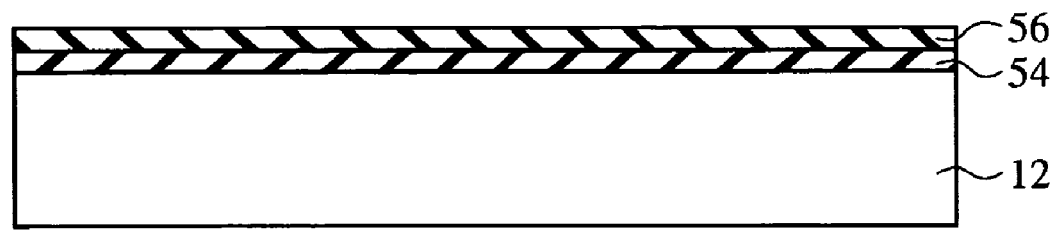

The oxide film 54 formed on the semiconductor substrate 12 is thus nitrided as illustrated in FIG. 2C, and a nitride film 56 is formed on the oxide film 54.

Then, the semiconductor substrate 12 is unloaded out of the reaction furnace 14.

Thus, the nitride film 56 is formed on the semiconductor substrate 12.

(Evaluation Result)

Figure 4:
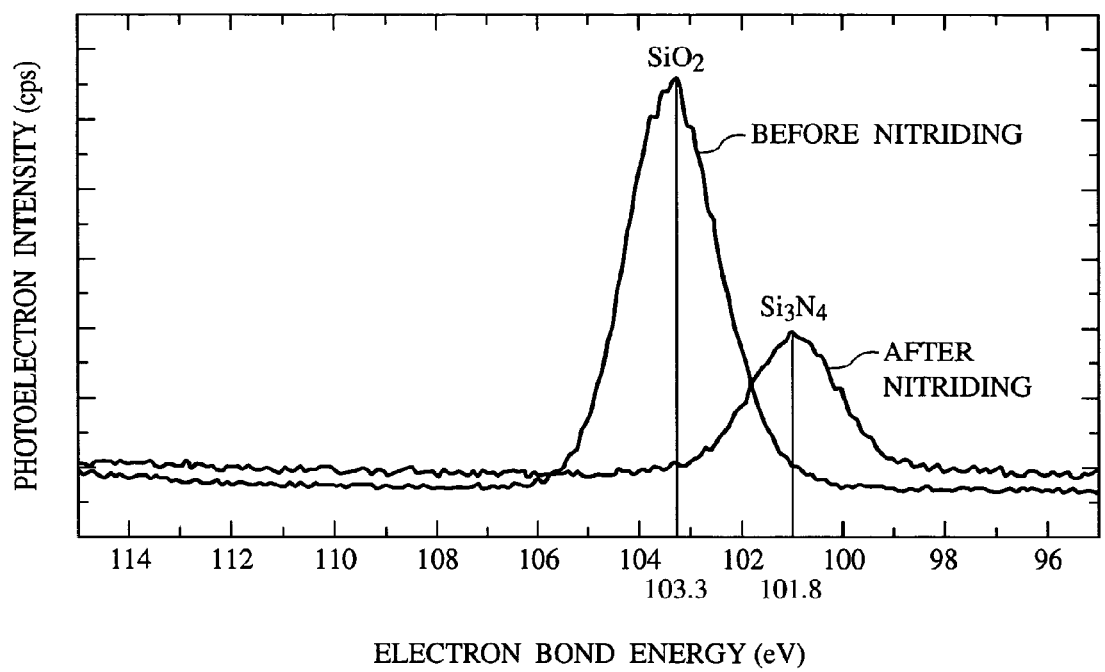
FIG. 4 is a graph of the result of the analysis by X-ray photoelectron spectroscopy.

Next, the result of evaluating the nitride film forming method according to the present embodiment will be explained with reference to FIG. 4. FIG. 4 is a graph of the result of the analysis by X-ray photoelectron spectroscopy (XPS). The bond energies of the electrons are taken on the horizontal axis, and the photoelectron intensities are taken on the vertical axis.

For the evaluation, the nitriding was performed under the following conditions. A silicon substrate was used as the semiconductor substrate 12. The film thickness of the silicon oxide film 54 was 100 nm. The pressure inside the reaction furnace 14 for the nitriding was the atmospheric pressure. The thermal processing temperature for the nitriding was 900° C. The oxygen and water concentrations in the high purity nitrogen gas to be fed into the reaction furnace 14 were below 1 ppb. The flow rate of the ultrahigh-purity nitrogen gas to be fed into the reaction furnace 14 for the nitriding was 5 cc/min. The thermal processing period of time for the nitriding was 2 hours.

As seen in FIG. 4, the peak of the spectrum before the nitriding was 103.3 eV. Based on this, it is seen that the silicon oxide film (SiO$_2$ film) 54 has been surely formed on the semiconductor substrate 10 before the nitriding.

As seen in FIG. 4, the peak of the spectrum after the nitriding was 101.8 eV. Based on this, it is seen that the silicon nitride film (Si$_3$N$_4$ film) 56 has been surely formed on the semiconductor substrate 10 after the nitriding.

As described above, according to the present embodiment, the thermal nitriding is performed by using ultrahigh-purity nitrogen gas containing oxygen and water of concentrations of 1 ppb or below, whereby the oxide film can be surely nitrided and nitride film of very good quality can be obtained without setting the thermal processing temperature very high. Thus, the present embodiment can provide semiconductor devices, etc. including nitride film of very good quality.

According to the present embodiment, the oxide film is modified by using a high purity inert gas, etc. before the oxide film is nitrided, which makes the oxide film easy to be nitrided. According to the present embodiment, nitride film of good quality can be formed.

(Modification 1)

Figure 5A:
FIGS. 5A to 5C are sectional views in the steps of the nitride film forming method according to Modification 1 of the first embodiment of the present invention.
Figure 5B:
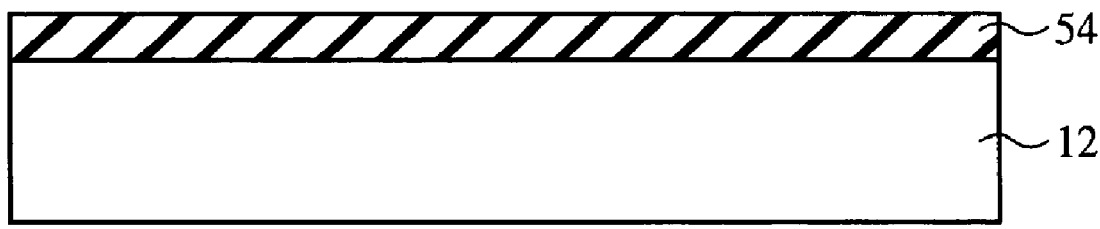
Figure 5C:
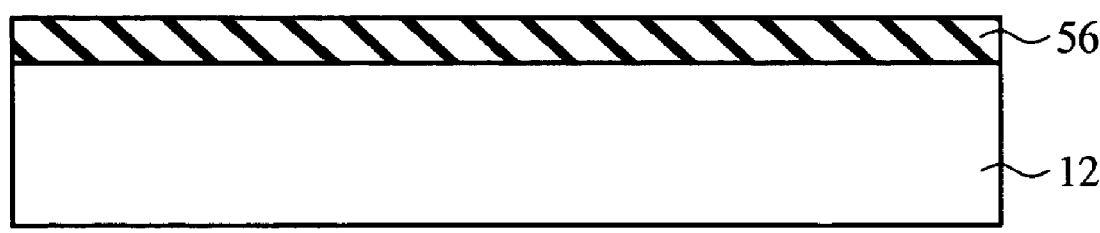

Next, the nitride film forming method according to Modification 1 of the present embodiment will be explained with reference to FIG. 1. FIGS. 5A to 5C are sectional views illustrating the nitride film forming method according to the present modification.

The nitride film forming method according to the present modification is characterized mainly in that an oxide film 54 formed on a semiconductor substrate 12 is entirely nitrided.

The steps up to the step of forming the silicon film 54 on the semiconductor substrate 12 including the silicon film forming step are the same as those of the nitride film forming method described above with reference to FIGS. 2A and 2B, and their explanation will not be repeated (see FIGS. 5A and 5B).

Next, the semiconductor substrate 12 is loaded into the reaction furnace 14 of the nitride film forming apparatus illustrated in FIG. 1.

Next, the inside of the reaction furnace 14 is decompressed while a high purity inert gas is being fed into the reaction furnace 14. The high purity inert gas is, e.g., high purity argon gas. The concentrations of oxygen and water in the high purity inert gas to be fed into the reaction furnace 14 are 1 ppb or below. Thus, the water, oxygen, etc. present in the reaction furnace 14, and the water, oxygen, etc. contained in the semiconductor substrate 12, etc. are removed so some extent.

Next, while the temperature inside the reaction furnace 14 is increasing up to, e.g., 900° C., the high purity inert gas is fed into the reaction furnace 14. The high purity inert gas is, e.g., high purity argon gas. The concentrations of oxygen and water in the high purity inert gas to be fed into the reaction furnace 14 are 1 ppb or below. Thus, the water, oxygen, etc. present in the reaction furnace 14, and the water, oxygen, etc. contained in the semiconductor substrate 12 are sufficiently removed. The high purity inert gas may be fed into the reaction furnace 14 after the temperature inside the reaction furnace 14 has been raised.

Next, with the pressure inside the reaction furnace 14 set at, e.g., 100 kPa and the temperature inside the reaction furnace 14 set at 1000° C., the high impurity inert gas is fed into the reaction furnace 14 to thereby modify the oxide film 54 on the semiconductor substrate 12. The oxide film 54 is modified so as to make the oxide film 54 easy to be nitrided in later steps.

In modifying the oxide film 54, the high impurity inert gas may be made into plasma by applying high-frequency electric power between the plate electrodes 32a, 32b. The use of the high impurity inert gas made into plasma can more surely modify the oxide film 54.

Next, the feed of the high purity inert gas into the reaction furnace 14 is stopped.

Next, with the thermal processing temperature inside the reaction furnace 14 set at a prescribed temperature, the ultrahigh-purity nitrogen gas is fed into the reaction furnace 14 to thereby nitride the oxide film 54. Conditions for nitriding the oxide film 54 are as exemplified below. The concentrations of oxygen and water in the ultrahigh-purity nitrogen gas to be fed into the reaction furnace 14 are 1 ppb or below. The flow rate of the ultrahigh-purity nitrogen gas is, e.g., 50 cc/min. The thermal processing temperature is, e.g., 1000° C. The pressure inside the reaction furnace 14 is, e.g., 100 kPa. The thermal processing period of time is, e.g. 60 minutes.

Thus, as illustrated in FIG. 5C, the oxide film 54 is entirely nitrided, and a nitride film 56 alone is formed on the semiconductor substrate 12.

Then, the semiconductor substrate 12 is unloaded out of the reaction furnace 14.

Thus, the nitride film 56 is formed on the semiconductor substrate 12.

The oxide film 54 formed on the semiconductor substrate 12 may be thus entirely nitrided to form the nitride film 56.

(Modification 2)

Figure 6A:
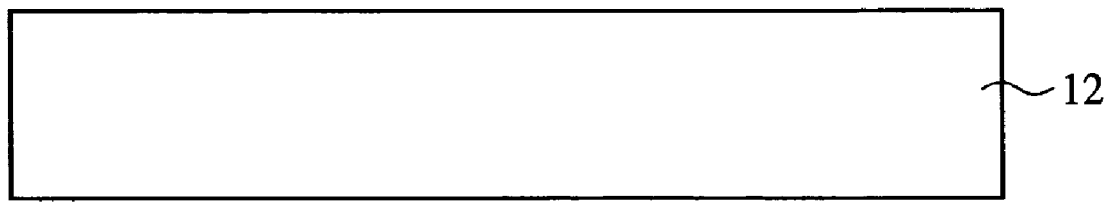
FIGS. 6A and 6B are sectional views in the steps of the nitride film forming method according to Modification 2 of the first embodiment of the present invention.
Figure 6B:
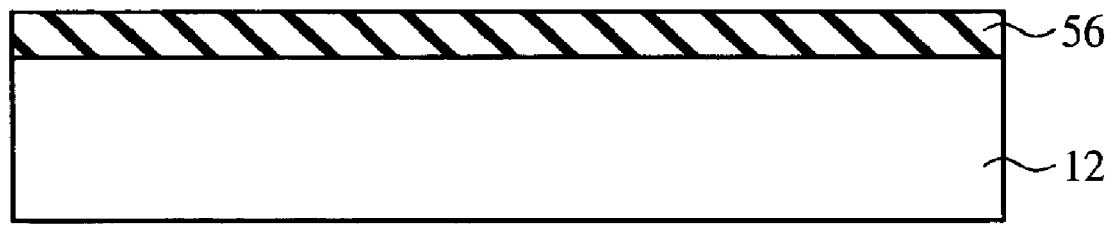

Next, the nitride film forming method according to Modification 2 of the present embodiment will be explained with reference to FIGS. 6A to 6C. FIGS. 6A to 6C are sectional views illustrating the nitride film forming method according to the present modification.

The nitride film forming method according to the present modification is characterized mainly in that a nitride film 56 is formed directly on a semiconductor substrate 12 without forming an oxide film on the semiconductor substrate 12.

First, as illustrated in FIG. 6A, the semiconductor substrate 12 is prepared. The semiconductor substrate 12 is, e.g., a silicon substrate.

Next, the semiconductor substrate 12 is loaded into the reaction furnace 14 of the nitride film forming apparatus illustrated in FIG. 1.

Next, while a high purity inert gas is being fed into the reaction furnace 14, the inside of the reaction furnace 14 is decompressed to, e.g., 100 kPa. The flow rate of the high purity inert gas to be fed into the reaction furnace 14 is, e.g., 50 cc/min. The oxygen and water concentrations in the high purity inert gas to be fed into the reaction furnace 14 are 1 ppb or below. The temperature inside the reaction furnace 14 at the time of decompressing the inside of the reaction furnace 14 is, e.g., 900° C. Thus, the water, oxygen, etc. present in the reaction furnace 14, and the water, oxygen, etc. contained in the semiconductor substrate 12 are removed.

Next, while the temperature inside the reaction furnace 14 is being raised to, e.g., 1000° C., the high purity inert gas is fed into the reaction furnace 14. The pressure inside the reaction furnace 14 at the time when the temperature inside the reaction furnace 14 is raised is, e.g., 100 kPa. The flow rate of the high purity inert gas to be fed into the reaction furnace 14 is, e.g., 50 cc/min. The concentrations of the oxygen and water in the high purity inert gas to be fed into the reaction furnace 14 are 1 ppb or below. Thus, the water, oxygen, etc. present in the reaction furnace 14, and the water, oxygen, etc. contained in the semiconductor substrate are further removed. Then, the feed of the high purity inert gas into the reaction furnace 14 is stopped.

Next, with the inside of the reaction furnace 14 set at a prescribed thermal processing, an ultrahigh-purity nitrogen gas is fed into the reaction furnace 14, whereby the surface of the semiconductor substrate 12 is nitrided. Conditions for nitriding the surface of the semiconductor substrate 12 are exemplified below. The oxygen and water concentrations in the ultrahigh-purity nitrogen gas to be fed into the reaction furnace 14 are 1 ppb or below. The thermal processing temperature is, e.g., 1000° C. The pressure inside the reaction furnace 14 is, e.g., 100 kPa. The flow rate of the ultrahigh-purity nitrogen gas is, e.g., 50 cc/min. The thermal processing period of time is, e.g., 60 minutes. Since the oxygen and water concentrations of the ultrahigh-purity nitrogen gas is 1 ppb or below, which is very low, the thermal nitride film can be formed directly on the semiconductor substrate 12 without setting the thermal processing temperature very high.

Thus, as illustrated in FIG. 6B, the surface of the semiconductor substrate 12 is nitrided, and the nitride film 56 is formed directly on the semiconductor substrate 12.

Then, the semiconductor substrate 12 is unloaded out of the reaction furnace 14.

As described above, the nitride film forming method according to the present modification is characterized mainly in that the nitride film 56 is formed directly on the semiconductor substrate 12 by thermal nitriding.

According to the present modification, the thermal nitriding is performed with nitrogen gas of the oxygen and water concentrations as low as 1 ppb or below being fed into the reaction furnace 14, which makes it possible to directly nitride the surface of the semiconductor substrate 12 without setting the thermal processing temperature very high. Thus, according to the present embodiment, the nitride film 56 can be formed directly on the semiconductor substrate 12 without damaging the semiconductor substrate 12, etc.

A Second Embodiment

The semiconductor device fabrication method according to a second embodiment of the present invention will be explained with reference to FIGS. 7A to 7D. FIGS. 7A to 7D are sectional views of a semiconductor device in the steps of the semiconductor fabrication method according to the present embodiment, which illustrate the method. The same members of the present embodiment as those of the nitride filming method according to the first embodiment illustrated in FIGS. 1 to 6B are represented by the same reference numbers not to repeat or to simplify their explanation.

Figure 7A:
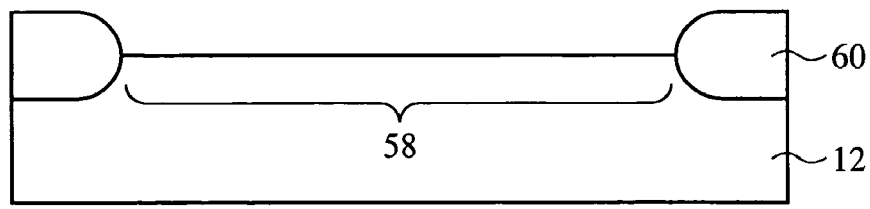
FIGS. 7A to 7D are sectional views of a semiconductor device in the steps of the semiconductor device fabrication method according to a second embodiment of the present invention.

First, as illustrated in FIG. 7A, a semiconductor substrate 12 is prepared. The semiconductor substrate 12 is, e.g., a silicon substrate.

Next, a device isolation film 60 for defining a device region 58 is formed by, e.g., LOCOS.

Figure 7B:
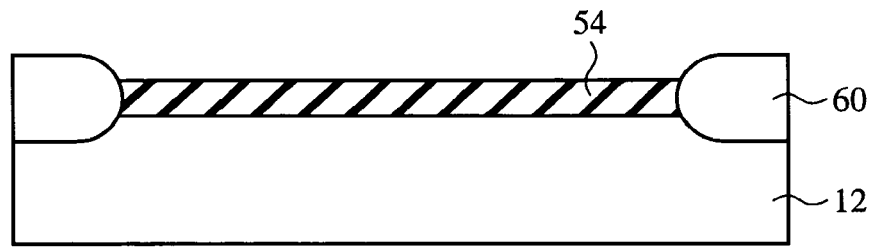

Next, as illustrated in FIG. 7B, an oxide film 54 is formed on the surface of the semiconductor substrate 12 by thermal oxidation. To form the oxide film 54 on the surface of the semiconductor substrate 12, another reaction furnace which is not the reaction furnace 14 in FIG. 1 is used. Another reaction furnace which is not the reaction furnace in FIG. 1 is used so as to prevent the oxide from adhering in the reaction furnace 14. The film thickness of the oxide film 54 is, e.g., 10 nm. When the semiconductor substrate 12 is a silicon substrate, a silicon oxide film 54 is formed on the silicon substrate 12.

Next, the semiconductor substrate 12 is loaded into the reaction furnace 14 of the nitride film forming apparatus illustrated in FIG. 1.

Next, in the same way as in the nitride film forming method according to the first embodiment, the surface of the oxide film 54 is nitrided to thereby form a nitride film 56 on the semiconductor substrate 12.

That is, while high purity inert gas is being fed into the reaction furnace 14, the inside of the reaction furnace 14 is decompressed. The oxygen and water concentrations in the high purity inert gas to be fed into the reaction furnace 14 are 1 ppb or below. Thus, the water, oxygen, etc. in the reaction furnace 14, and the water, oxygen, etc. contained in the semiconductor substrate 12, etc. are removed to some extent.

Next, while the temperature inside the reaction furnace 14 is being raised to, e.g., 900° C., the high purity inert gas is fed into the reaction furnace 14. The oxygen and water concentration in the high purity inert gas to be fed into the reaction furnace 14 are 1 ppb or below. Thus, the water, oxygen etc. present in the reaction furnace 14, and the water, oxygen, etc.

contained in the semiconductor substrate 12 are further removed. The high purity inert gas may be fed into the reaction furnace 14 after the temperature inside the reaction furnace 14 has been raised.

Next, with the pressure inside the reaction furnace 14 set at, e.g., 100 kPa and the temperature inside the reaction furnace 14 set at, e.g., 1000° C., the high purity inert gas is fed into the reaction furnace 14, whereby the oxide film 54 on the semiconductor substrate 12 is modified. The oxide film 54 is modified so as to make the nitriding of the oxide film 54 easy in later steps.

When the oxide film 54 is modified, the high purity inert gas may be made into plasma by applying high-frequency electric power between the plate electrodes 32a, 32b. The use of the high purity inert gas made into plasma can more surely modify the oxide film 54. Then, the feed of the high purity inert gas into the reaction furnace 14 is stopped.

Then, with the inside of the reaction furnace 14 set at a prescribed thermal processing temperature, an ultrahigh-purity nitrogen gas is fed into the reaction furnace 14, whereby the oxide film 54 is nitrided. Conditions for nitriding the oxide film 54 are as exemplified below. The oxygen and water concentrations in the high purity nitrogen gas are 1 ppb or below. The thermal processing temperature is, e.g., 1000° C. The pressure inside the reaction furnace 14 is, e.g., 100 kPa. The flow rate of the ultrahigh-purity nitrogen gas is, e.g., 50 cc/min. The thermal processing period of time is, e.g., 60 minutes.

Figure 7C:
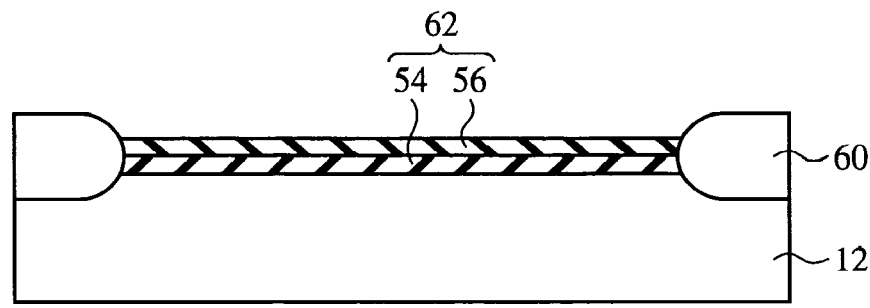
Figure 7D:
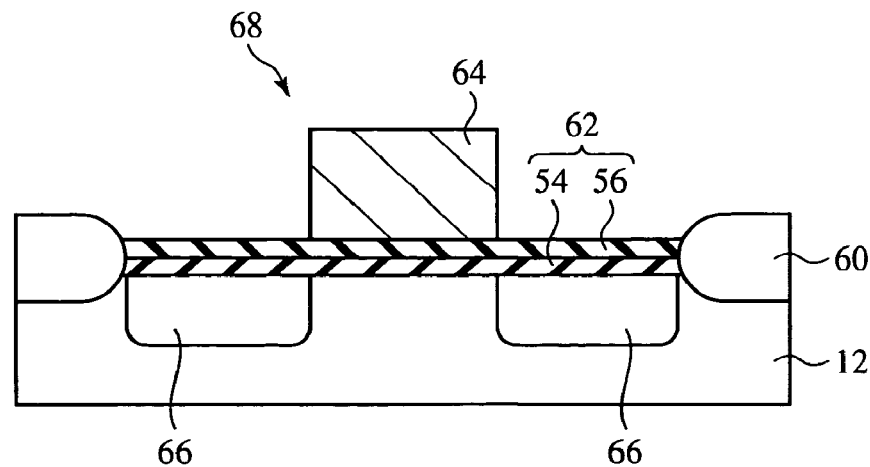

Thus, as illustrated in FIG. 7C, the surface of the oxide film 54 is nitrided, and the nitride film 56 is formed on the oxide film 54. The oxide film 54 and the nitride film 56 constitute the gate insulation film 62 of the transistors.

Then, the semiconductor substrate 12 is unloaded out of the reaction furnace 14.

Next, a polysilicon film 64 with a dopant impurity implanted is formed on the entire surface by, e.g., CVD. The film thickness of the polysilicon film 64 is, e.g., 200 nm.

Then, the polysilicon film 64 is patterned by photolithography. Thus, a gate electrode 64 of polysilicon is formed (see FIG. 7D).

Next, a dopant impurity is implanted in the semiconductor substrate 12 on both sides of the gate electrode 64 by, e.g., ion implantation to thereby for a source/drain diffused layer 66.

Thus, a transistor 68 comprising the gate electrode 64 formed on the semiconductor substrate 12 with the gate insulation film 62 formed therebetween, and the source/drain diffused layer 66 formed on both sides of the gate electrode 64 is fabricated.

Thus, the semiconductor device according to the present embodiment is fabricated.

As described above, according to the present embodiment, the ultrahigh-purity nitrogen having the oxygen and water concentrations of 1 ppb or below is used in the nitriding, which makes it possible to form the nitride film 56 of good quality without setting the thermal processing temperature very high. The gate insulation film 62 is formed of the nitride film 56 of good quality, whereby the dopant impurity, such as boron, etc. contained in the gate electrode 64 is hindered from passing through he gate insulation film and reaching the inside of the semiconductor substrate 12. The gate insulation film is formed of the nitride film 56 of good quality, whereby the operation speed is increased, and the life of the gate insulation film can be made long. Thus, according to the present embodiment, the semiconductor device having good electric characteristics and long life can be provided.

(Modification 1)

Then, the semiconductor device fabrication method according to Modification 1 of the present invention will be explained with reference to FIGS. 8A to 8D. FIGS. 8A to 8D are sectional views of a semiconductor device in the steps of the semiconductor device fabrication method according to the present modification.

The semiconductor device fabrication method according to the present modification is characterized mainly in that the oxide film 54 formed on the semiconductor substrate 12 is entirely nitrided to thereby form a gate insulation film 62a of the nitride film 56 alone.

Figure 8A:
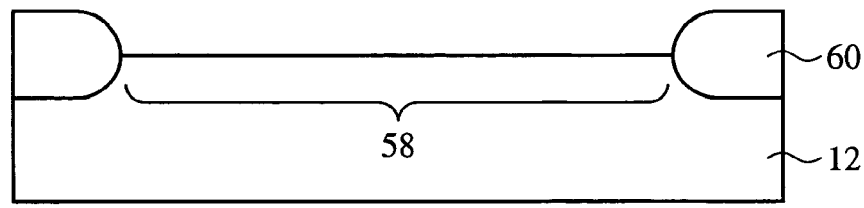
FIGS. 8A to 8D are sectional views of a semiconductor device in the steps of the semiconductor device fabrication method according to Modification 1 of the second embodiment of the present invention.
Figure 8B:
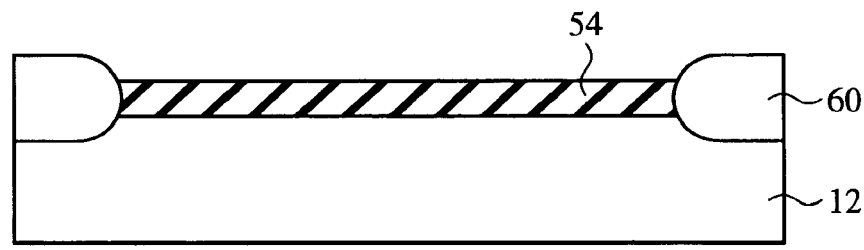

First, the steps up to the step of forming the oxide film 54 on the semiconductor substrate 12 or including the oxide film 54 forming step are the same as those of the semiconductor device fabrication method described above with reference to FIGS. 7A and 7B, and their explanation will not be repeated (see FIGS. 8A and 8B).

Next, the semiconductor substrate 12 is loaded into the reaction furnace 14 of the nitride film forming apparatus.

Then, in the same way as in the nitride film forming method according to Modification 1 of the first embodiment, the entire oxide film 54 is nitrided, whereby the gate insulation film 62a of the nitride film 56 alone is formed.

That is, while the high purity inert gas is being fed into the reaction furnace 14, the inside of the reaction furnace 14 is decompressed. The oxygen and water concentrations in the high purity inert gas to be fed into the reaction furnace 14 are 1 ppb or below. Thus, the water, oxygen, etc. in the reaction furnace 14, and the water, oxygen, etc. contained in the semiconductor substrate 12, etc. are removed to some extent.

Next, while the temperature in the reaction furnace 14 is being raised to, e.g., 900° C., the high purity inert gas is fed into the reaction furnace 14. The oxygen and water concentrations in the high purity inert gas to be fed into the reaction furnace 14 are 1 ppb or below. Thus, the water, oxygen, etc. in the reaction furnace 14, and the water, oxygen, etc. contained in the semiconductor substrate 12, etc. are sufficiently removed. The high purity inert gas may be fed into the reaction furnace 14 after the temperature inside reaction furnace 14 has been raised.

Next, with the pressure inside the reaction furnace 14 set at, e.g., 100 kPa and the temperature inside the reaction furnace 14 set at 1000° C., the high purity inert gas is fed into the reaction furnace 14 to thereby modify the oxide film 54 on the semiconductor substrate 12.

The high purity inert gas may be made into plasma by applying high-frequency electric power between the plate electrodes 32a, 32b when the oxide film 54 is modified. The use of the high purity inert gas made into plasma can more surely modify the oxide film 54. Then, the feed of the high purity inert gas into the reaction furnace 14 is stopped.

Then, with the inside of the reaction furnace 14 set at a prescribed thermal processing temperature, the ultrahigh-purity nitrogen gas is fed into the reaction furnace 14 to thereby nitride the oxide film 54. Conditions for nitriding the oxide film 54 are as exemplified below. The oxygen and water concentrations in the ultrahigh-purity nitrogen gas is 1 ppb or below. The thermal processing temperature is, e.g., 1000° C. The pressure inside the reaction furnace 14 is, e.g., 100 kPa. The flow rate of the ultrahigh-purity nitrogen gas is, e.g., 50 cc/min. The thermal processing period of time is, e.g., 60 minutes.

Figure 8C:
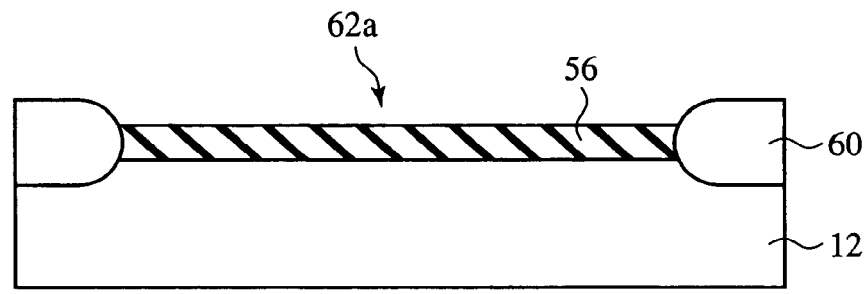

Thus, as illustrated in FIG. 8C, the entire oxide film 54 is nitrided, and the gate insulation film 62a of the nitride film 56 alone is formed on the semiconductor substrate 12.

Then, the semiconductor substrate 12 is unloaded out of the reaction furnace 14.

Figure 8D:
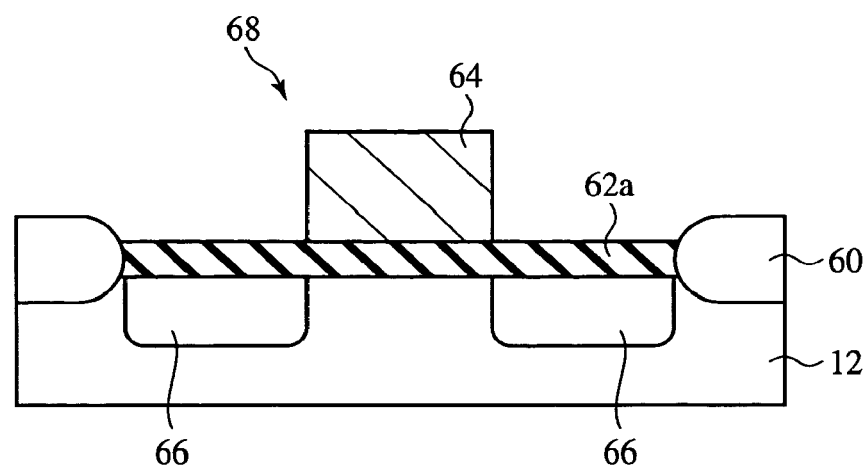

The flowing steps of the semiconductor device fabrication method are the same as those of the semiconductor device fabrication method described above with reference to FIG. 7D, and their explanation will not be repeated (see FIG. 8D).

As described above, the oxide film 54 formed of the semiconductor substrate 12 may be entirely nitrided to form the gate insulation film 62a of the nitride film 56 alone.

(Modification 2)

Figure 9A:
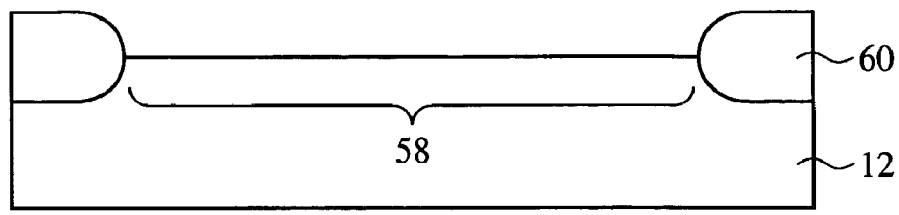
FIGS. 9A to 9C are sectional views of a semiconductor device in the steps of the semiconductor device fabrication method according to Modification 2 of the second embodiment of the present invention.
Figure 9B:
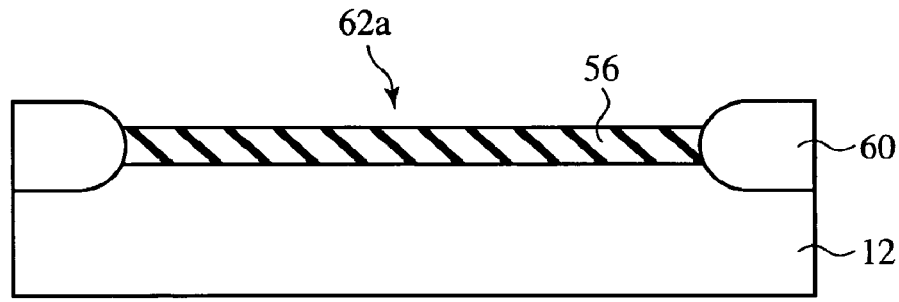
Figure 9C:
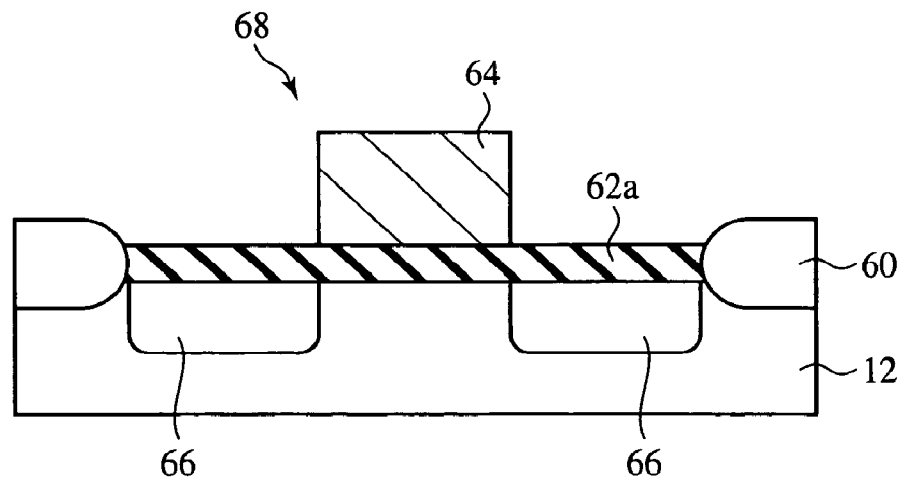

Then, the semiconductor device fabrication method according to Modification 2 of the present embodiment will be explained with reference to FIGS. 9A to 9C. FIGS. 9A to 9C are sectional views of a semiconductor device in the steps of the semiconductor device fabrication method according to the present modification, which illustrate the method.

The semiconductor device fabrication method according to the present modification is characterized mainly in that a gate insulation film 62a of the nitride film 56 is formed directly on the semiconductor substrate 12 without forming the oxide film 54 on the semiconductor substrate 12.

The step up to the step of forming the device isolation film 60 on the semiconductor substrate 12 are the same as those of the semiconductor device fabrication method described above with reference to FIG. 7A, and their explanation will not be repeated (see FIG. 9A).

Next, the semiconductor substrate 12 is loaded into the reaction furnace 14 of the nitride film forming apparatus illustrated in FIG. 1.

Then, in the same way as in the nitride film forming method according to Modification 2 of the first embodiment, the surface of the semiconductor substrate 12 is nitrided to thereby form the nitride film 56 directly on the semiconductor substrate 12.

That is, with the high purity inert gas being fed into the reaction furnace 14, the inside of the reaction furnace 14 is decompressed to, e.g., 66.5 Pa. The flow rate of the high purity inert gas to be fed into the reaction furnace 14 is, e.g., 50 cc/min. The oxygen and water concentrations in the high purity inert gas to be fed into the reaction furnace 14 are 1 ppb or below. The temperature inside reaction furnace 14 at the time when the inside of the reaction furnace 14 is decompressed is, e.g., 900° C. Thus, the water, oxygen, etc. in the reaction furnace 14, and the water, oxygen, etc. contained in the semiconductor substrate 12 are removed to some extent.

Next, with the temperature inside the reaction furnace 14 being raised to, e.g., 1000° C., the high purity inert gas is fed into the reaction furnace 14. The pressure inside the reaction furnace 14 at the time when the temperature inside the reaction furnace 14 is, e.g., 100 kPa. The flow rate of the high purity inert gas to be fed into the reaction furnace 14, e.g., 50 cc/min. The oxygen and water concentrations in the high purity inert gas to be fed into the reaction furnace 14 are 1 ppb or below. Thus, the water, oxygen, etc. in the reaction furnace 14, and the water, oxygen, etc. contained in the semiconductor substrate 12 are sufficiently removed. Then, the feed of the high purity inert gas into the reaction furnace 14 is stopped.

Next, with the inside of the reaction furnace 14 set at a prescribed thermal processing temperature, the ultrahigh-purity nitrogen gas is fed into the reaction furnace 14 to thereby nitride the surface of the semiconductor substrate 12. Conditions for nitriding the surface of the semiconductor substrate 12 are as exemplified below. The oxygen and water concentrations in the ultrahigh-purity nitrogen gas are, e.g., 1 ppb or below. The thermal processing temperature is, e.g., 1000° C. The pressure inside the reaction furnace 14 is, e.g., 100 kPa.

The flow rate of the ultrahigh-purity nitrogen gas is, e.g., 50 cc/min. The thermal processing period of time is, e.g., 60 minutes.

Thus, the surface of the semiconductor substrate 12 is nitrided, and the gate insulation film 62a of the nitride film 56 is formed directly on the semiconductor substrate 12 (see FIG. 9B).

Then, the semiconductor substrate 12 is unloaded out of the reaction furnace 14.

The following steps of the semiconductor device fabrication method are the same as those the semiconductor device fabrication method described above with reference to FIG. 7A, and their explanation will not be repeated (see FIG. 9C).

As described above, the gate insulation film 62a of the nitride film 56 may be formed directly on the semiconductor substrate 12.

A Third Embodiment

The capacitor fabrication method according to a third embodiment of the present invention will be explained with reference to FIGS. 10A to 10E. FIGS. 10A to 10E are sectional views illustrating the steps of the capacitor fabrication method according to the present embodiment. The same members of the present embodiment as hose of the nitride film forming method, etc. according to the first or the second embodiment illustrated in FIGS. 1 to 9C are represented by the same reference numbers not to repeat or to simplify their explanation.

Figure 10A:
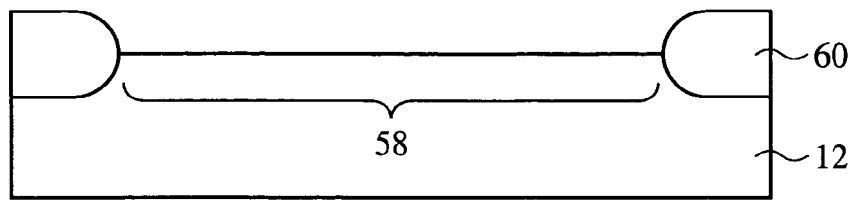
FIGS. 10A to 10E are sectional views illustrating the capacitor fabrication method according to a third embodiment of the present invention.

First, as illustrated in FIG. 10A, a semiconductor substrate 12 is prepared. The semiconductor substrate 12 is, e.g., a silicon substrate.

Next, a device isolation film 60 for defining a device region 58 is formed by, e.g. LOCOS.

Figure 10B:
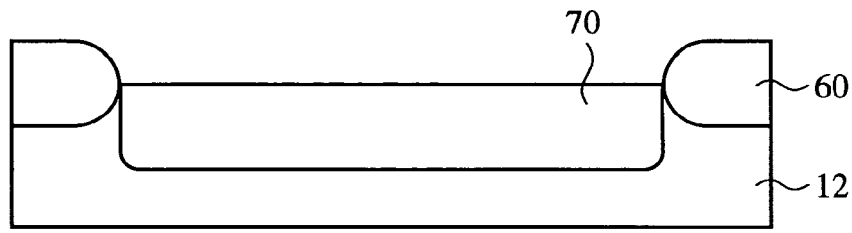

Then, as illustrated in FIG. 10B, an N type dopant impurity is heavily implanted in the semiconductor substrate 12 in the device region 58 by, e.g., ion implantation. The dopant impurity is, e.g., phosphorus (P) or antimony (Sb). Ion implantation conditions are, e.g., a 70 keV acceleration energy and a $1 \times 10^{15}$ atoms/cm$^2$ dose. Thus, an N$^+$ type impurity diffused layer 70 with the dopant impurity heavily doped is formed. The impurity diffused layer 70 is to be the lower electrode 70 of the capacitor.

An N type dopant impurity is implanted to thereby form the N$^+$ type impurity diffused layer 70 here, but a P type dopant impurity is implanted to thereby form the P$^+$ type impurity diffused layer 70.

Figure 10C:
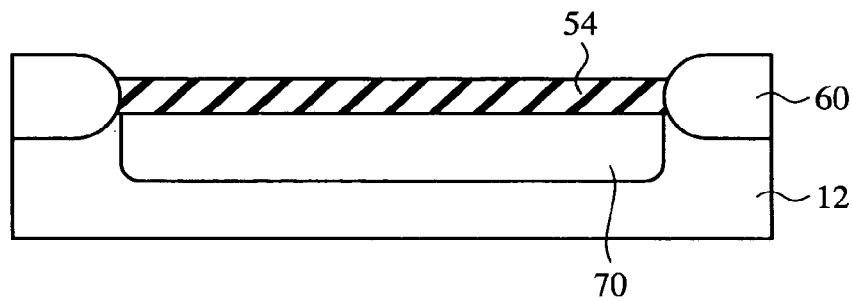

Then, as illustrated in FIG. 10C, an oxide film 54 is formed on the surface of the semiconductor substrate 12 by thermal oxidation. To form the oxide film 54 on the surface of the semiconductor substrate 12, another reaction furnace which is not the reaction furnace 14 in FIG. 1 is used. Another reaction furnace which is not the reaction furnace 14 in FIG. 1 is used to form the oxide film 54 so as to prevent the oxide from adhering in the reaction furnace 14. The film thickness of the oxide film 54 is, e.g., 5 nm. When the semiconductor substrate 12 is a silicon substrate, the silicon oxide film 54 is formed on the silicon substrate 12.

Next, the semiconductor substrate 12 is loaded into the reaction furnace 14 of the nitride film forming apparatus illustrated in FIG. 1.

Figure 10D:
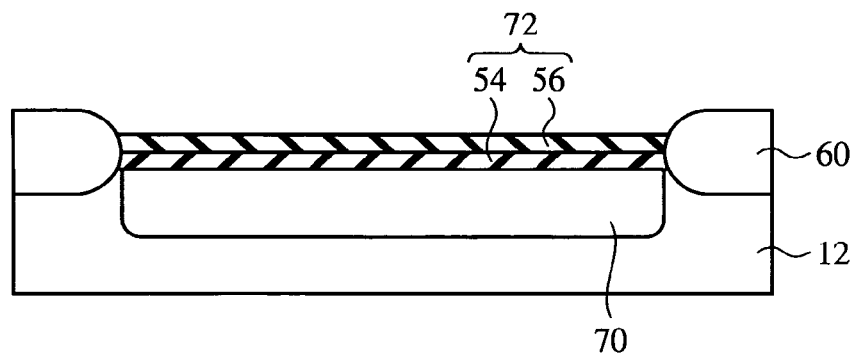

Next, in the same way as in the nitride film forming method according to the first embodiment, the oxide film 54 is nitrided to thereby form a nitride film 56 on the semiconductor substrate (see FIG. 10D).

That is, first, with a high purity inert gas being fed into the reaction furnace 14, the inside of the reaction furnace 14 is decompressed. The oxygen and water concentrations in the high purity inert gas to be fed into the reaction furnace 14 are 1 ppb or below. Thus, the water, oxygen, etc. present in the reaction furnace 14, and the water, oxygen contained in the semiconductor substrate 12, etc. are removed to some extent.

Next, while the temperature inside the reaction furnace 14 is being raised to, e.g., 900° C., the high purity inert gas is fed into the reaction furnace 14. The oxygen and water concentrations in the high purity inert gas to be fed into the reaction furnace 14 are 1 ppb or below. Thus, the water and oxygen in the reaction furnace 14, and the water and oxygen contained in the semiconductor substrate 12, etc, are sufficiently removed. The high purity inert gas may be fed into the reaction furnace 14 after the temperature inside the reaction furnace 14 has been raised.

Next, with the pressure inside the reaction furnace 14 set at, e.g., 100 kPa and the temperature inside the reaction furnace 14 set at 1000° C., the high purity inert gas is fed into the reaction furnace 14, whereby the oxide film 54 on the semiconductor substrate 12 is modified. The oxide film 54 is modified so as to make the oxide film 54 easy to be nitrided in later steps.

The high purity inert gas may be made into plasma by applying high-frequency electric power between the plate electrodes 32a, 32b when the oxide film 54 is modified. The use of the high purity inert gas made into plasma can more surely modify the oxide film 54.

Then, the feed of the high purity inert gas into the reaction furnace 14 is stopped.

Then with the inside of the reaction furnace 14 set at a prescribed thermal processing temperature, the ultrahigh-purity nitrogen gas is fed into the reaction furnace 14 to thereby nitride the oxide film 54. Conditions for nitriding the oxide film 54 are as exemplified below. The thermal processing temperature is, e.g., 1000° C. The pressure inside the reaction furnace 14 is, e.g., 100 kPa. The flow rate of the ultrahigh-purity nitrogen gas is, e.g., 50 cc/min. The thermal processing temperature is, e.g., 60 minutes.

Thus, the surface of the oxide film 54 is nitrided, and the nitride film 56 is present on the oxide film 54. The oxide film 54 and the nitride film 56 constitute a capacitor dielectric film 72.

Then, the semiconductor substrate 12 is unloaded out of the reaction furnace 14.

Next, a polysilicon film 74 with a dopant impurity implanted in is formed on the entire surface by, e.g., CVD. The thickness of the polysilicon film 74 is, e.g., 200 nm.

Then, the polysilicon film 74 is patterned by photolithography. Thus, an upper electrode 74 of the polysilicon is formed.

Figure 10E:
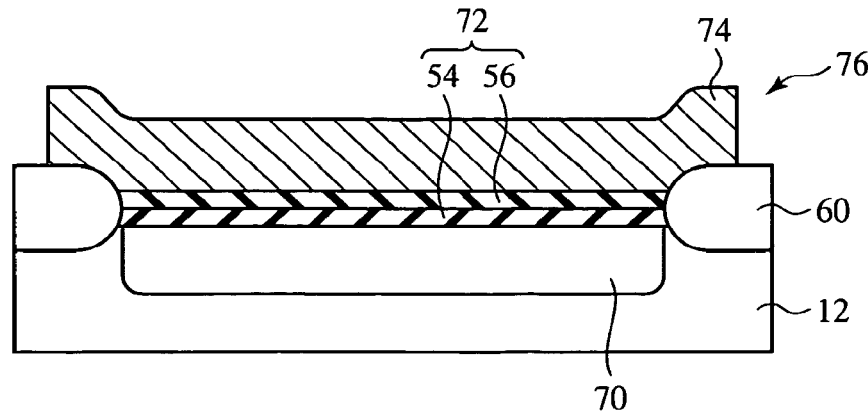

Thus, a capacitor 76 comprising the lower electrode 70, the dielectric film 72 and the upper electrode 74 is fabricated (see FIG. 10E).

Then, a lead wire (not illustrated) electrically connected to the lower electrode 70 is formed.

As described above, according to the present embodiment, the thermal processing is performed, using the ultrahigh-purity nitrogen to form the nitride film 56, whereby the capacitor dielectric film 72 including the nitride film 56 of very high quality can be fabricated. Thus, according to the present embodiment, the capacitor 76 having very good electric characteristics can be provided.

(Modification 1)

Next, the capacitor fabrication method according to Modification 1 of the present embodiment will be explained with reference to FIGS. 11A to 11E. FIGS. 11A to 11E are sectional views illustrating the capacitor fabrication method according to the present modification.

The capacitor fabrication method according to the present modification is characterized mainly in that the oxide film 54 formed on the semiconductor substrate 12 is entirely nitrided to form the capacitor dielectric film 72a.

Figure 11A:
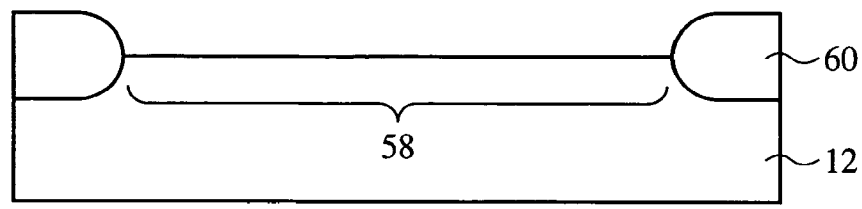
FIGS. 11A to 11E are sectional views illustrating the capacitor fabrication method according to Modification 1 of the third embodiment of the present invention.
Figure 11B:
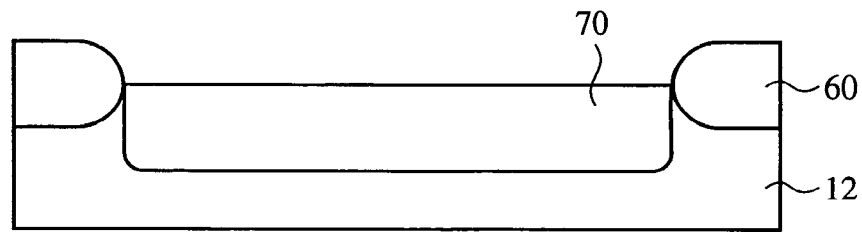
Figure 11C:
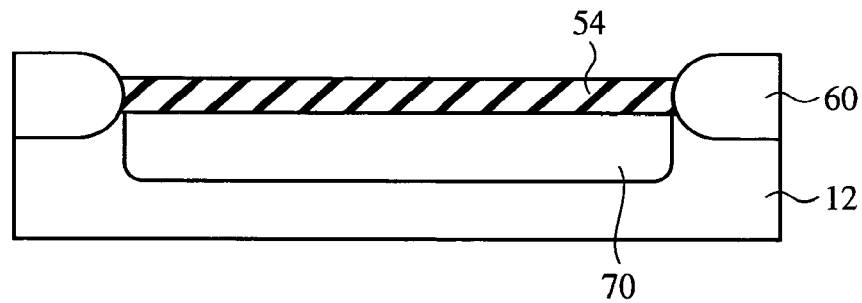

First, the steps up to the step of forming the silicon oxide film 54 on the semiconductor substrate 12 are the same as those of the capacitor fabrication method described above with reference to FIGS. 10A to 10C, and their explanation will not be repeated (see FIG. 11A to 11C).

Next, the semiconductor substrate 12 is loaded into the reaction furnace 14 of the nitride film forming apparatus illustrated in FIG. 1.

Figure 11D:
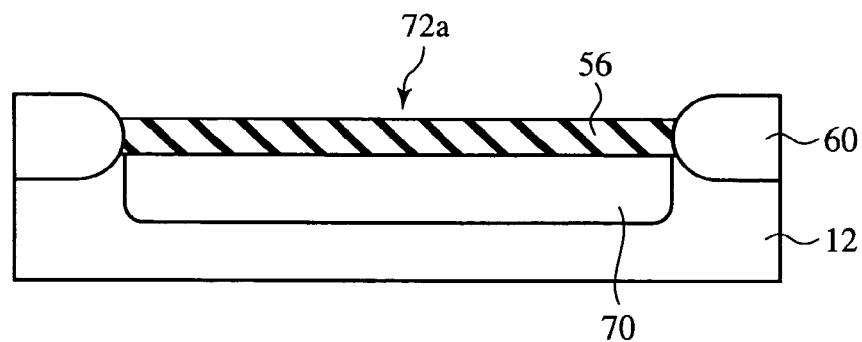

Then, in the same way as in the nitride film forming method according to Modification 2 of the first embodiment, the entire oxide film 54 is nitrided to form the gate insulation film 72a of the nitride film 56 alone (see FIG. 11D).

That is, while the high purity inert gas is being fed into the reaction furnace 14, the inside of the reaction furnace 14 is decompressed. The oxygen and water concentrations in the high purity inert gas to be fed into the reaction furnace 14 are 1 ppb or below. Thus, the water, oxygen, etc. in the reaction furnace 14, and the water and oxygen contained in the semiconductor substrate 12 are removed to some extent.

Then, while the temperature inside the reaction furnace 14 is being raised up to, e.g., 900° C., the high purity inert gas is fed into the reaction furnace 14. The oxygen and water concentrations in the high purity inert gas to be fed into the reaction furnace 14 are 1 ppb or below. Thus, the water and oxygen in the reaction furnace 14, and the water an oxygen contained in the semiconductor substrate 12 are sufficiently removed. The high purity inert gas may be fed into the reaction furnace 14 after the temperature in the reaction furnace 14 is raised.

Then, with the pressure inside the reaction furnace 14 set at, e.g., 100 kaP and the temperature inside reaction furnace 14 set at, e.g., 1000° C., the high purity inert gas is fed into the reaction furnace 14 to thereby modify the oxide film 54 on the semiconductor substrate 12. The oxide film 54 is modified so as to make the oxide film 54 easy to be nitrided in later steps.

The high purity inert gas may be made into plasma by applying high-frequency electric power between the plate electrodes when the oxide film 54 is modified. The use of the high purity inert gas made into plasma can more surely modify the oxide film 54.

Next, the feed of the high purity inert gas into the reaction furnace 14 is stopped.

Then, with the inside of the retain furnace 14 set at a prescribed thermal processing temperature, the ultrahigh-purity nitrogen gas is fed into the reaction furnace 14 to nitride the oxide film 54. Conditions for nitriding the oxide film 54 are as exemplified below. The thermal processing temperature is, e.g., 1000° C. The pressure inside the reaction furnace 14 is, e.g., 100 kPa. The flow rate of the ultrahigh-purity nitrogen gas is, e.g., 50 cc/min. The thermal processing period of time is, e.g., 60 minutes.

Thus, the entire oxide film 54 is nitrided, and the capacitor dielectric film 72a of the nitride film 56 alone is formed on the semiconductor substrate 12.

Then, the semiconductor substrate 12 is unloaded out of the reaction furnace 14.

The following steps of the capacitor fabrication method are the same as those of the capacitor fabrication method described above with reference to FIG. 10E, and their explanation will not be repeated.

Figure 11E:
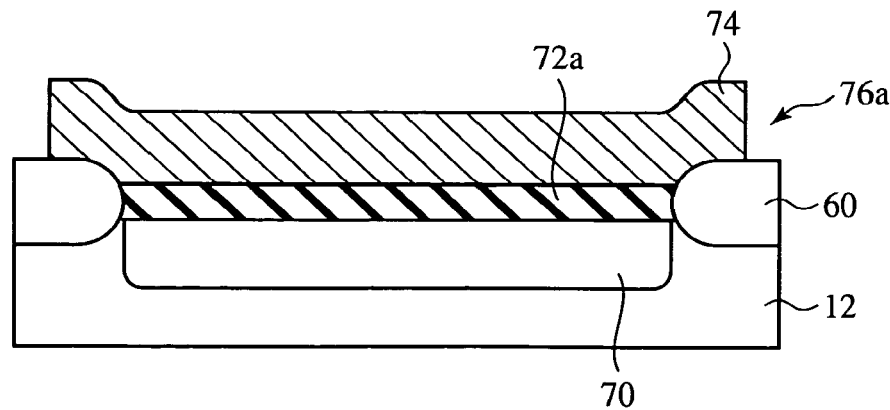

Thus, the capacitor 76a comprising the lower electrode 70, the dielectric film 72a and the upper electrode 74 is fabricated (see FIG. 11E).

As described above, the entire oxide film 54 formed on the semiconductor substrate 12 may be nitrided to form the capacitor dielectric film 72a of the nitride film 56 alone.

(Modification 2)

Next, the capacitor fabrication method according to Modification 2 of the present embodiment will be explained with reference to FIGS. 12A to 12D. FIGS. 12A to 12D are sectional views illustrating the capacitor fabrication method according to the present modification.

The capacitor fabrication method according to the present modification is characterized mainly in that the capacitor dielectric film of the nitride film 56 is formed directly on the semiconductor substrate 12 without forming the oxide film 54 on the semiconductor substrate 12.

Figure 12A:
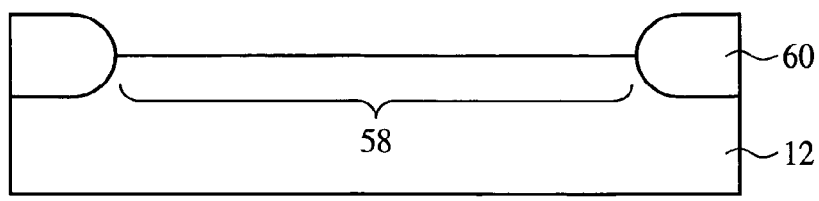
FIGS. 12A to 12D are sectional views illustrating the capacitor fabrication method according to Modification 2 of the third embodiment of the present invention.
Figure 12B:
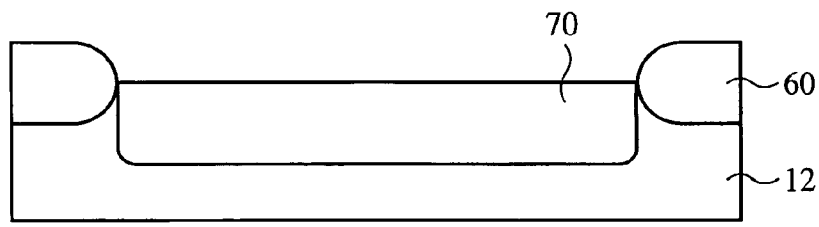

First, the steps up to the step of forming the lower electrode 70 in the semiconductor substrate 12 are the same as those of the capacitor fabrication method described above with reference to FIGS. 10A and 10B, and their explanation will not be repeated (FIGS. 12A and 12B).

Then, the semiconductor substrate 12 is loaded into the reaction furnace 14 of the nitride film forming apparatus illustrated in FIG. 1.

Figure 12C:
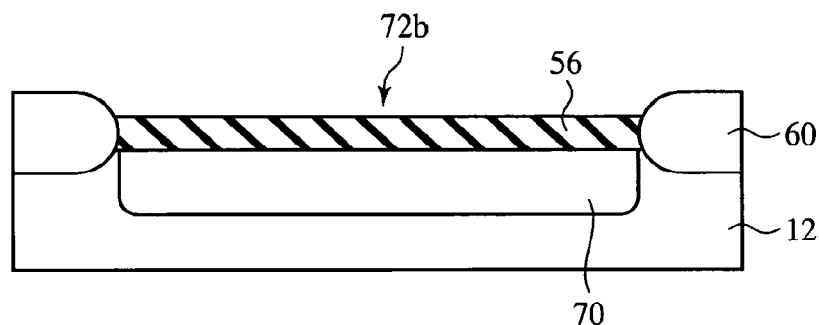

Next, in the same way as in the nitride film forming method according to the first embodiment, the surface of the semiconductor substrate 12 is nitrided, and the capacitor dielectric film 72a of the nitride film 56 is formed (see FIG. 12C).

That is, with the high purity inert gas being fed into the reaction furnace 14, the inside of the reaction furnace 14 is decompressed to 66.5 Pa. The flow rate of the high purity inert gas to be fed into the reaction furnace 14 is, e.g., 50 cc/min. The oxygen and water concentrations in the high purity inert gas to be fed into the reaction furnace 14 are, e.g., 1 ppb or below. The temperature inside the reaction furnace 14 at the time when the inside of the reaction furnace 14 is decompressed is, e.g., 900° C. To decompress the inside of the reaction furnace 14, the rotary pump and the cryopump are suitably used. Thus, the water and oxygen in the reaction furnace 14, and the water and oxygen contained in the semiconductor substrate 12 are removed to some extent.

Next, while the temperature inside the reaction furnace 14 is being raised to, e.g., 1000° C., the high purity inert gas is fed into the reaction furnace 14. The pressure inside the reaction furnace 14 at the time when the temperature inside the reaction furnace 14 is raised is, e.g., 100 kPa. The flow rate of the high purity inert gas to be fed into the reaction furnace 14 is, e.g., 50 cc/min. The oxygen and water concentrations in the high purity inert gas to be fed into the reaction furnace 14 are 1 ppb or below. Thus, the water and oxygen in the reaction furnace 14, and the water and oxygen contained I the semiconductor substrate 12 are sufficiently removed.

Then, the feed of the high purity inert gas into the reaction furnace 14 is stopped.

Then, with the inside of the reaction furnace 14 set at a prescribed thermal processing temperature, the ultrahigh-purity nitrogen gas is fed into the reaction furnace 14 to nitride the surface of the semiconductor substrate 12. Conditions for nitriding the surface of the semiconductor substrate 12 are as exemplified below. The thermal processing temperature is, e.g., 1000° C. The pressure inside the reaction furnace 14 is, e.g., 100 kPa. The flow rate of the ultrahigh-purity nitrogen gas is, e.g., 50 cc/min. The thermal processing period of time is, e.g., 60 minutes.

Thus, the surface of the semiconductor substrate 12 is nitrided, and the capacitor dielectric film 72a of the nitride film 56 is formed directly on the semiconductor substrate 12.

Then, the semiconductor substrate 12 is unloaded out of the reaction furnace 14.

The flowing steps of the capacitor fabrication method are the same as those of the capacitor fabrication method described above with reference to FIG. 10E, and their explanation will not be repeated.

Figure 12D:
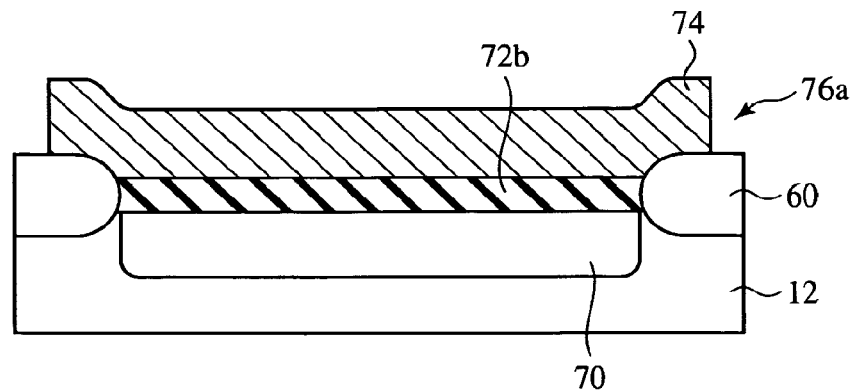

Thus, the capacitor 76a comprising the lower electrode 70, the dielectric film 72a and the upper electrode 74 is fabricated (see FIG. 12D).

As described above, the capacitor dielectric film 72a of the nitride film 56 may be formed directly on the semiconductor substrate 12.

A Fourth Embodiment

The capacitor fabrication method according to a fourth embodiment of the present invention will be explained with reference to FIGS. 13A to 14B. FIGS. 13A to 14B are sectional views illustrating the capacitor fabrication method according to the present embodiment. The same members of the present embodiment as those of the nitride forming method, etc. according to the first to the third embodiments illustrated in FIGS. 1 to 12D are represented by the same reference numbers not to repeat or to simplify their explanation.

The capacitor fabrication method according to the present embodiment is characterized mainly in that a semiconductor layer 80 with a dopant impurity implanted in is formed on a semiconductor substrate 12 to form a lower electrode 80 of the semiconductor layer.

Figure 13A:
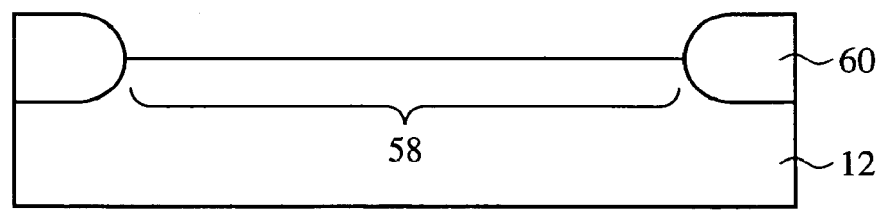
FIGS. 13A to 13D are sectional views illustrating the capacitor fabrication method according to a fourth embodiment of the present invention (Part 1).

First, the steps up to the step of forming a device isolation film 60 including the device isolation film forming step are the same as those of the capacitor fabrication method illustrated in FIG. 10A, and their explanation will not be repeated (see FIG. 13A).

Figure 13B:
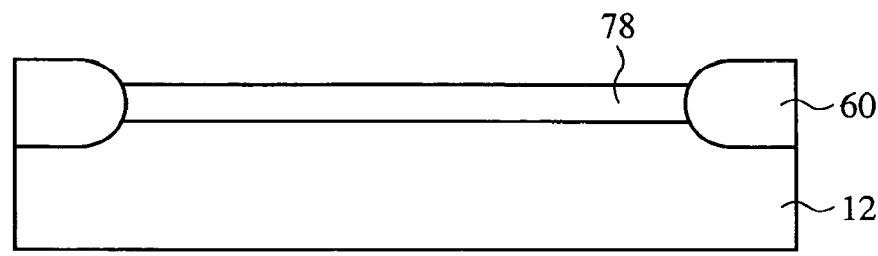
Figure 13C:
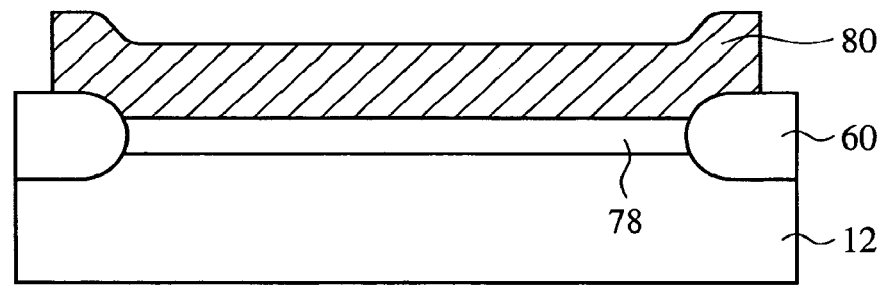

Next, as illustrated in FIG. 13B, an oxide film 78 is formed on the surface of the semiconductor substrate 12 in a device region 58 by thermal oxidation. When the semiconductor substrate 12 is a silicon substrate, the silicon oxide film 78 is formed. The film thickness of the silicon oxide film 78 is, e.g., 200 nm.

Next, a polysilicon film 70 with a dopant impurity implanted in is formed on the entire surface by, e.g., CVD. The film thickness of the polysilicon film 80 is, e.g., 200 nm.

Then, the polysilicon film 80 is patterned by photolithography. Thus, the lower electrode 80 of the polysilicon is formed (see FIG. 13C).

Figure 13D:
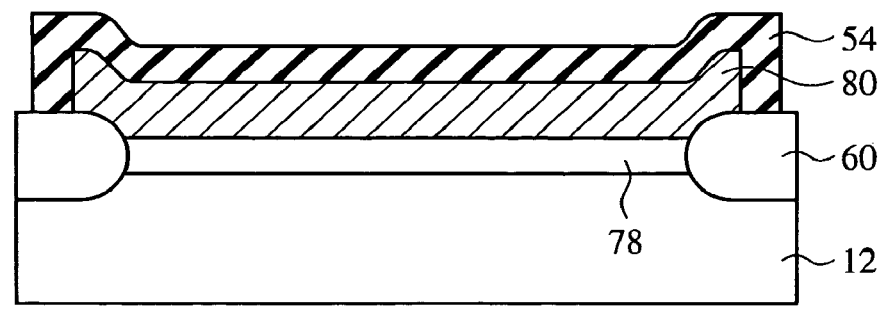

Then, as illustrated in FIG. 13D, an oxide film 54 is formed on the surface of the lower electrode 80 by thermal oxidation. To form the oxide film 54 on the surface of the lower electrode 80, another reaction surface which is not the reaction furnace in FIG. 1 is used. Another reaction furnace which is not the reaction furnace 14 in FIG. 1 is used so as to prevent the oxide from adhering in the reaction furnace 14. The film thickness of the oxide film 54 is, e.g., 5 nm.

Next, the semiconductor substrate 12 is loaded into the reaction furnace 14 of the nitride film forming apparatus illustrated in FIG. 1.

Figure 14A:
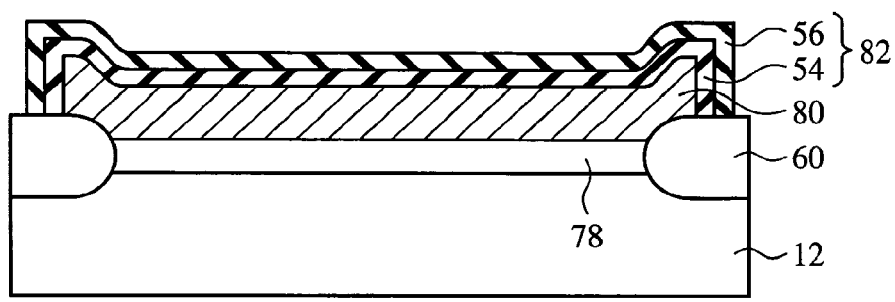
FIGS. 14A and 14B are sectional views illustrating the capacitor fabrication method according to a fourth embodiment of the present invention (Part 2).

Next, in the same way as in the nitride film forming method according to the first embodiment, the surface of the oxide film 54 is nitrided to form a nitride film 56 (see FIG. 14A).

That is, while the high purity inert gas is being fed into the reaction furnace 14, the inside of the reaction furnace 14 is decompressed. The oxygen and water concentrations in the high purity inert gas to be fed into the reaction furnace 14 are 1 ppb or below. Thus, the water and oxygen in the reaction furnace 14, and the water and oxygen contained in the semiconductor substrate 12, etc. are removed to some extent.

Next, while the temperature inside the reaction furnace 14 is being raised to, e.g., 900° C., the high purity inert gas is fed into the reaction furnace 14. The oxygen and water concentrations in the high purity inert gas to be fed into the reaction furnace 14 are 1 ppb or below. Thus, the water and oxygen in the reaction furnace 14, and the water and oxygen contained in the semiconductor substrate 12 are sufficiently removed. The high purity inert gas may be fed into the reaction furnace 14 after the temperature inside the reaction furnace 14 has been raised.

Next, with the pressure inside the reaction furnace 14 set at, e.g., 100 kPa and the temperature inside the reaction furnace 14 set at, e.g., 1000° C. The high purity inert gas is fed into the reaction furnace 14 to modify the oxide film 54 on the semiconductor substrate 12. The oxide film 54 is modified so as to make the oxide film 54 easy to be nitrided in later steps.

The high purity inert gas may be made into plasma by applying high-frequency electric power between the plate electrodes 32a, 32b when the oxide film 54 is modified. The use of the high purity inert gas made into plasma can more surely modify the oxide film 54.

Next, the feed of the high purity inert gas into the reaction furnace 14 is stopped.

Then, with the inside of the reaction furnace 14 set at a prescribed thermal processing temperature, the ultrahigh-purity nitrogen gas is fed into the reaction furnace 14 to nitride the oxide film 54. Conditions for nitriding the oxide film 54 are as exemplified below. The thermal processing temperature is, e.g., 1000° C. The pressure inside the reaction furnace 14 is, e.g., 100 kPa. The flow rate of the ultrahigh-purity nitrogen gas is, e.g., 50 cc/min. The thermal processing period of time is, e.g., 60 minutes.

Thus, the surface of the oxide film 54 is nitrided, and the nitride film 56 is present on the oxide film 54. The oxide film 54 and the nitride film 56 constitute a capacitor dielectric film 82.

Then, the semiconductor substrate 12 is unloaded out of the reaction furnace 14.

Next, a polysilicon film 84 with a dopant impurity implanted in is formed on the entire surface by, e.g., CVD. The film thickness of the polysilicon film 84 is, e.g., 200 nm.

Then, the polysilicon film 84 is patterned by photolithography. Thus, an upper electrode 84 of the polysilicon is formed.

Figure 14B:
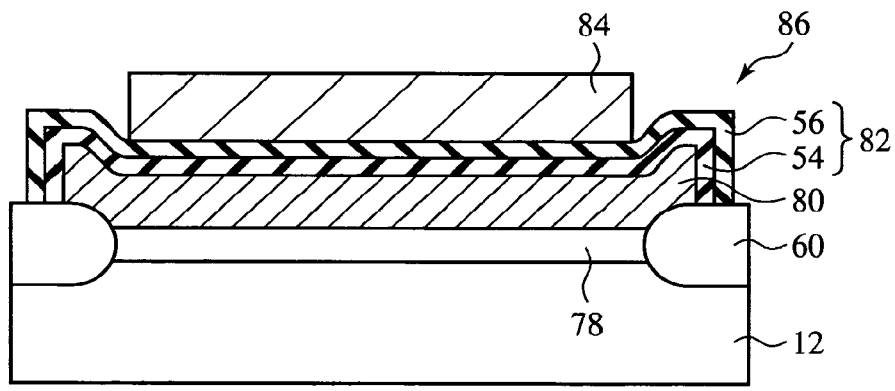
Figure 15A:
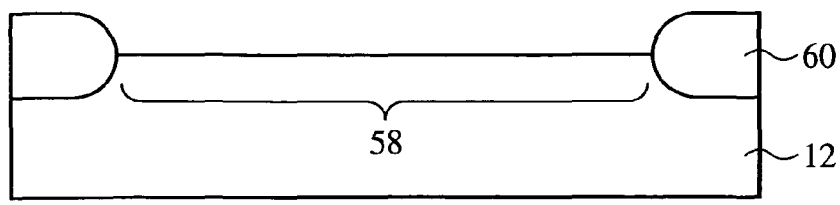
FIGS. 15A to 15D are sectional views illustrating the capacitor fabrication method according to Modification 1 of the fourth embodiment of the present invention (Part 1).
Figure 15B:
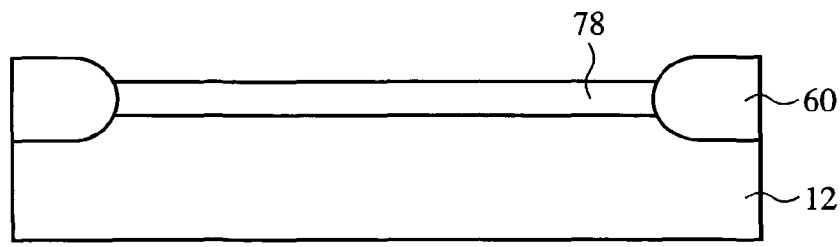
Figure 15C:
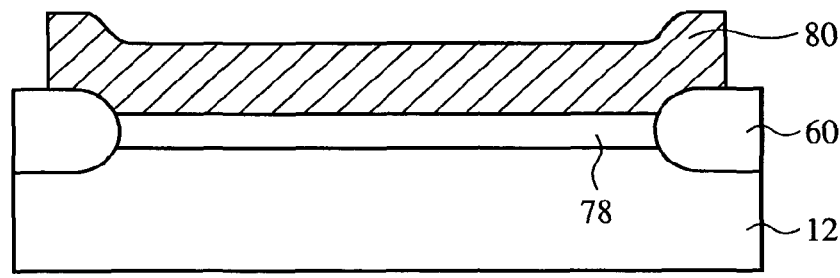
Figure 15D:
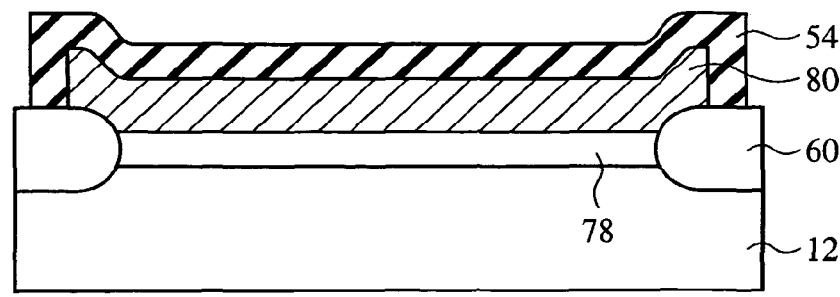

Thus, a capacitor 86 comprising the lower electrode 80, the capacitor dielectric film 82 and the upper electrode 84 is fabricated (see FIG. 14B).

As described above, the semiconductor layer 80 with a dopant impurity implanted in may be formed on the semiconductor substrate 12 to form the lower electrode 80 of the semiconductor layer.

(Modification 1)

Next, the capacitor fabrication method according to Modification 1 of the present embodiment will be explained with reference to FIGS. 15A to 16B. FIGS. 15A to 16B are sectional views illustrating the capacitor fabrication method according to the present modification.

The capacitor fabrication method according to the present modification is characterized mainly in that the oxide film 54 formed on the lower electrode 80 is entirely nitrided to form the capacitor dielectric film 82a of the nitride film 86.

First, the steps to the step of forming the oxide film 54 on the surface of the lower electrode 80 are the same as those of the capacitor fabrication method described above with reference to FIG. 13A to 13D, and their explanation will not be repeated (see FIGS. 15A to 15D).

Next, the semiconductor substrate 12 is loaded into the reaction furnace 14 of the nitride film forming apparatus illustrated in FIG. 1.

Figure 16A:
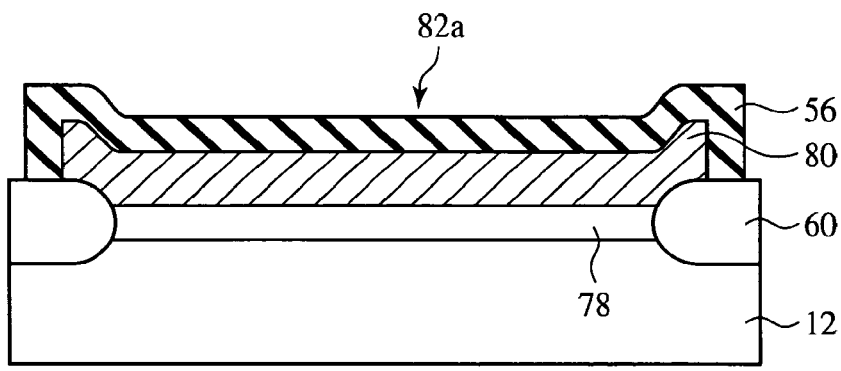
FIGS. 16A and 16B are sectional views illustrating the capacitor fabrication method according to Modification 1 of the fourth embodiment of the present invention (Part 2).

Then, in the same way as in the nitride film forming method according to Modification 1 of the present embodiment, the entire oxide film 54 is nitrided to form the gate insulation film 82a of the nitride film 56 alone (see FIG. 16A).

That is, first, while the high purity inert gas is being fed into the reaction furnace 14, the inside of the reaction furnace 14 is decompressed. The oxygen and water concentrations in the high purity inert gas to be fed into the reaction furnace 14 are 1 ppb or below. Thus, the water and oxygen in the reaction furnace 14, and the water and oxygen contained in the semiconductor substrate 12, etc. are removed to some extent.

Then, while the temperature inside the reaction furnace 14 is being raised to, e.g., 900° C., the high purity inert gas is fed into the reaction furnace 14. The water and oxygen concentration in the high purity inert gas to be fed into the reaction furnace 14 are 1 ppb or below. Thus, the water and oxygen in the reaction furnace 14, and the water and oxygen contained in the semiconductor substrate 12 are sufficiently removed. The high purity inert gas may be fed into the reaction furnace 14 after the temperature inside the reaction furnace 14 has been raised.

Then, with the pressure inside the reaction furnace 14 set at, e.g., 100 kPa and the temperature inside the reaction furnace 14 set at 1000° C., the high purity inert gas is fed into the reaction furnace 14 to modify the oxide film 54 on the semiconductor substrate 12. The oxide film 54 is modified so as to make the oxide film 54 easy to be nitrided in later steps.

The high purity inert gas may be made into plasma by applying high-frequency electric power between the plate electrodes 32a, 32b when the oxide film 54 is modified. The use of the high purity inert gas made into plasma can more surely modify the oxide film 54.

Next, the feed of the high purity inert gas into the reaction furnace 14 is stopped.

Then, with the inside of the reaction furnace 14 set at a prescribed thermal processing temperature, the ultrahigh-purity nitrogen gas is fed into the reaction furnace 14 to nitride the oxide film 54. Conditions for nitriding the oxide film 54 are as exemplified below. The thermal processing temperature is, e.g., 1000° C. The pressure inside the reaction furnace 14 is, e.g., 100 kPa. The flow rate of the ultrahigh nitrogen gas is, e.g., 50 cc/min. The thermal processing period of time is, e.g., 60 minutes.

Thus, the entire oxide film 54 is nitrided, and the capacitor dielectric film 82a of the nitride film 56 alone is formed on the semiconductor substrate 12.

Then, the semiconductor substrate 12 is unloaded out of the reaction furnace 14.

The following steps of the capacitor fabrication method are the same as those of the capacitor fabrication method described above with reference to FIG. 14B, and their explanation will not be repeated.

Figure 16B:
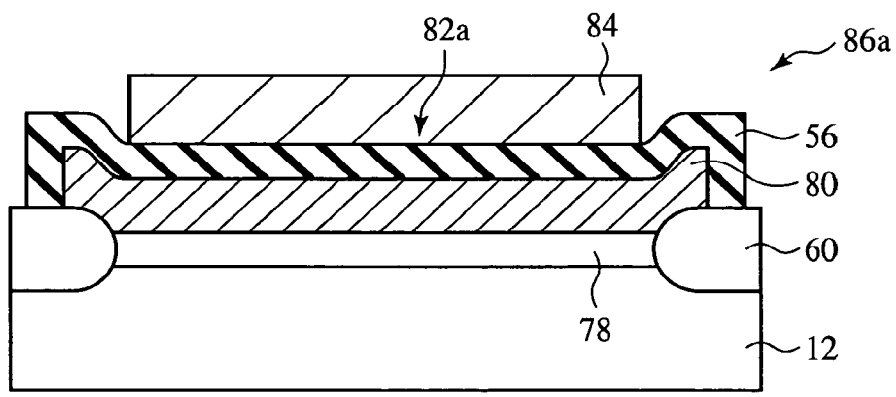

Thus, the capacitor 86a comprising the lower electrode 80, the capacitor dielectric film 82a and the upper electrode 84 is fabricated (see FIG. 16B).

As described above, the oxide film formed on the lower electrode 80 may be entirely nitrided to form the capacitor dielectric film 82a of the nitride film 56 alone.

(Modification 2)

Next, the capacitor fabrication method according to Modification 2 of the present embodiment will be explained with reference to FIGS. 17A to 17E. FIGS. 17A to 17E are sectional views illustrating the capacitor fabrication method according to the present modification.

The capacitor fabrication method according to the present modification is characterized mainly in that the capacitor dielectric film 82a of the nitride film 56 is formed directly on the lower electrode 80 without forming the oxide film 54 on the lower electrode.

Figure 17A:
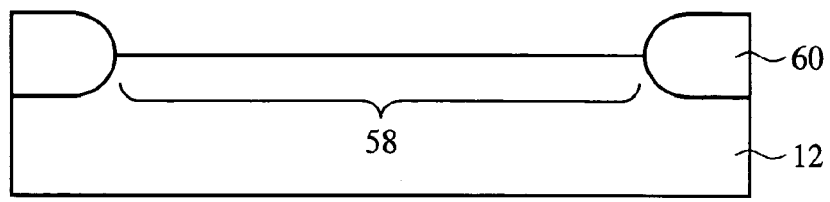
FIGS. 17A to 17E are sectional views illustrating the capacitor fabrication method according to Modification 2 of the fourth embodiment of the present invention.
Figure 17B:
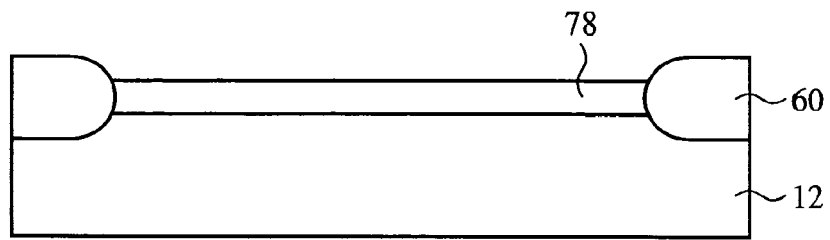
Figure 17C:
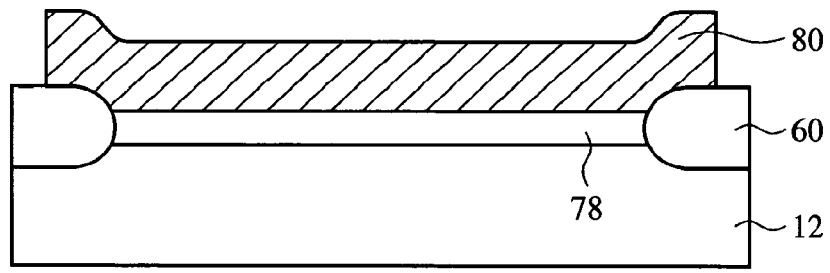

First, the steps to the step of forming the lower electrode 80 including the lower electrode 80 forming step are the same as those of the capacitor fabrication method described above with reference to FIGS. 13A to 13C, and their explanation will not be repeated (see FIGS. 17A to 17C).

Then, the semiconductor substrate 12 is loaded into the reaction furnace 14 of the nitride film forming apparatus in FIG. 1.

Figure 17D:
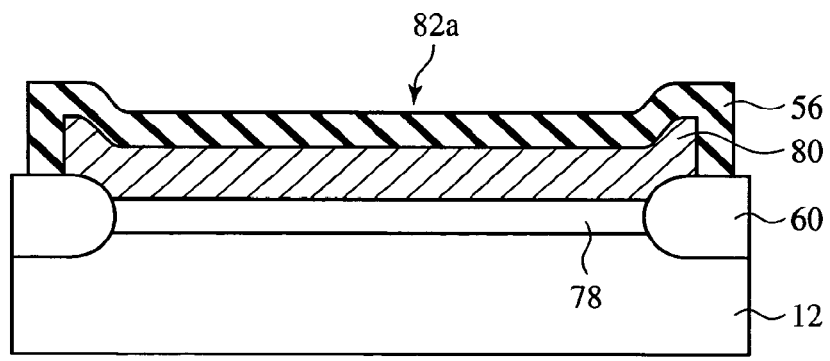

Next, in the same way as in the nitride film forming method according to Modification 2 of the first embodiment, the capacitor dielectric film 82a of the nitride film 56 is formed on the lower electrode 80 (see FIG. 17D).

That is, with the high purity inert gas being fed into the reaction furnace 14, the inside of the reaction furnace 14 is decompressed to, e.g., 66.5 Pa. The flow rate of the high purity inert gas to be fed into the reaction furnace 14 is, e.g., 50 cc/min. The oxygen and water concentrations in the high purity inert gas to be fed into the reaction furnace 14 are 1 ppb or below. The temperature inside the reaction furnace 14 at the time when the inside of the reaction furnace 14 is decompressed is, e.g., 900° C. Thus, the water and oxygen in the reaction furnace 14, and the water and oxygen contained in the semiconductor substrate 12 are removed to some extent.

Next while the temperature inside the reaction furnace 14 is being raised to, e.g., 1000° C., the high purity inert gas is fed into the reaction furnace 14. The pressure inside the reaction furnace 14 at the time when the temperature inside the reaction furnace 14 is raised is, e.g., 100 kPa. The flow rate of the high purity inert gas to be fed into the reaction furnace 14 is, e.g., 50 cc/min. The oxygen and water concentrations in the high purity inert gas to be fed into the reaction furnace 14 are 1 ppb or below. Thus, the water an oxygen in the reaction furnace 14, and the water and oxygen contained in the semiconductor substrate 12 are sufficiently removed.

Next, the feed of the high purity inert gas into the reaction furnace 14 is stopped.

Next, with the inside of the reaction furnace 14 set at a prescribed thermal processing temperature, the ultrahigh-purity nitrogen gas is fed into the reaction furnace 14 to nitride the surface of the semiconductor substrate 12. Conditions for nitriding the surface of the semiconductor substrate 12 are as exemplified below. The thermal processing temperature is, e.g., 1000° C. The pressure inside the reaction furnace 14 is, e.g., 100 kPa. The flow rate of the ultrahigh-purity nitrogen gas is, e.g., 50 cc/min. The thermal processing period of time is, e.g., 60 minutes.

Thus, the surface of the lower electrode 80 is nitrided, and the capacitor dielectric film 82a of the nitride film 56 is formed directly on the lower electrode 80.

Then, the semiconductor substrate 12 is unloaded out of the reaction furnace 14.

The following steps of the capacitor fabrication method are the same as those of the capacitor fabrication method described above with reference to FIG. 14B, and their explanation will not be repeated.

Figure 17E:
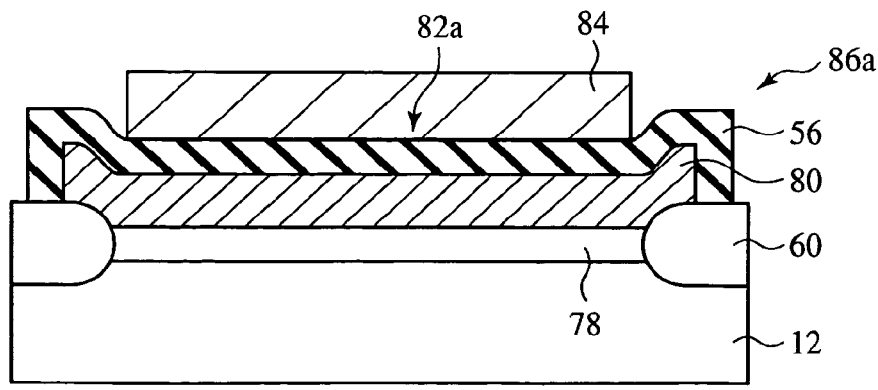

Thus, the capacitor 86a comprising the lower electrode 80, the capacitor dielectric film 82a and the upper electrode 84 is fabricated (see FIG. 17E).

As described above, the capacitor dielectric film 82a of the nitride film 56 may be formed directly on the lower electrode 80.

Modified Embodiments

The present invention is not limited to the above-described embodiments and can cover other various modifications.

For example, in the above-described embodiments, the nitride film forming apparatus is of batch processing, which make thermal processing at once on a plurality of semiconductor substrates 12. However, the nitride film forming apparatus may be of single wafer processing, which makes thermal processing one semiconductor substrate 12. The nitride film forming apparatus may be of load-lock type, which loads and unloads wafers without exposing the reaction furnace to the atmosphere.

In the above-described embodiments, the semiconductor substrate 12 is a silicon substrate. However, the semiconductor substrate 12 is not limited to a silicon substrate. The principle of the present invention is applicable to forming the nitride film 56 on the semiconductor substrate 12 of any other material. For example, the material of the semiconductor substrate 12 can be germanium (Ge) or others. The material of the semiconductor substrate 12 may be a compound semiconductor.

In the above-described embodiments, the semiconductor layer 80 is a silicon layer. However, the material of the semiconductor layer is not essentially silicon. The principle of the present invention is applicable to forming the nitride film 56 on the semiconductor layer 80 of any other material.

In the above-describe embodiments, the material of the lower electrode 80 is a semiconductor. However, the material of the lower electrode 80 may be a metal, such as aluminum (Al) or others.

In the above-described embodiments, the gas fed into the reaction furnace 14 to modify the oxide film 54 is argon gas. However, the gas fed into the reaction furnace 14 to modify the oxide film 54 is not essentially argon gas. An inert gas other than argon gas may be fed into the reaction furnace 14. When an inert gas other than argon gas is used as the gas to be fed into the reaction furnace 14, the oxygen and water concentrations in the inert gas are preferably 1 ppb or below. A reducing gas may be fed into the reaction furnace 14. The reducing gas can be, e.g., hydrogen or others. When a reducing gas is used as the gas to be fed into the reaction furnace 14, the oxygen and water concentrations in the reducing gas are preferably 1 ppb or below. A mixed gas of an inert gas and a reducing gas may be fed into the reaction furnace 14. When a mixed gas is used as the gas to be fed into the reaction furnace 14, the oxygen and water concentration in the mixed gas are preferably 1 ppb or below.

In the above-described embodiments, when the oxide film 54 is modified, argon gas is made into plasma. An inert gas other than argon gas may be made into plasma. A reducing gas may be made into plasma. A mixed gas of an inert gas and a reducing gas may be made into plasma. The use of the gas made into plasma can accelerate the modification.

Figure 18:
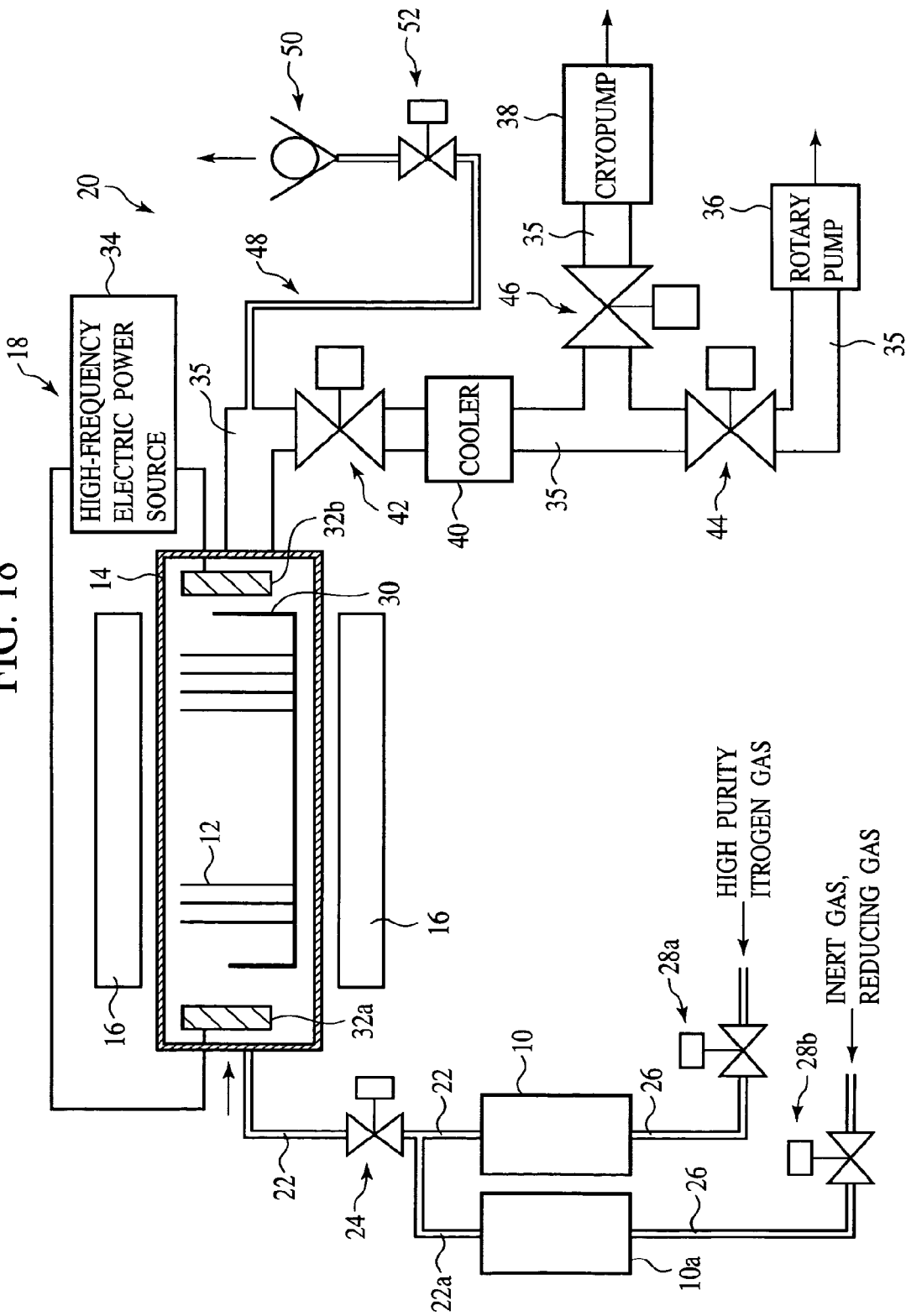
FIG. 18 is a block diagram of the nitride forming apparatus according to a modified embodiment of the present invention.

In the above-described embodiments, the inert gas, the reducing gas or their mixed gas are purified by the ultrahigh-purity gas purifier for nitrogen. However, an ultrahigh-purity gas purifier for purifying the inert gas, the reducing gas or their mixed gas may be disposed separate from the ultrahigh-purity gas purifier for nitrogen. FIG. 18 is a block diagram of the nitride film forming apparatus according to a modified embodiment of the present invention. As illustrated in FIG. 18, an ultrahigh-purity gas purifier 10a for purifying the inert gas, etc. is provided separate from the ultrahigh-purity gas purifier for nitrogen 10. For example, the ultrahigh-purity gas purifier for the inert gas 10a can decrease the concentrations of $H_2O$, $O_2$, $H_2$, CO, $CO_2$, $N_2$, $CH_4$ respectively to 1 ppb or below. The ultrahigh-purity gas purifier 10a is connected to the reaction furnace 14 through a pipe 22a. The inside wall of the pipe 22 is nitrided. Specifically, an about 1 μm-10 μm-thickness nitride film is formed on the inside wall of the pipe 22a. The inside wall of the pipe 22a is nitrided so as to make substances present in the inside wall of the pipe 22a immobile to prevent the mixing of impurities, such as oxygen, water, etc. into the inert gas, etc. purified by the ultrahigh-purity gas purifier 10a. The use of such pipe 22a can retain the oxygen and water concentrations in the inert gas, etc. to be fed into the reaction furnace 14 to be respectively 1 ppb or below. As described above, the ultrahigh-purity gas purifier 10a for purifying the inert gas, reducing gas or their mixed gas may be provided separate from the ultrahigh-purity gas purifier for nitrogen 10.

What is claimed is:

1. A capacitor fabrication method comprising:
    a first step of forming a lower electrode in or over a semiconductor substrate;
    a second step of loading the semiconductor substrate into a reaction furnace, and decompressing the inside of the reaction furnace to remove oxygen and water from the inside of the reaction furnace and the semiconductor substrate;
    a third step of heating the reaction furnace to further remove the oxygen and water from the inside of the reaction furnace and the semiconductor substrate;
    a fourth step of purifying nitrogen gas to have the oxygen concentration of 1 ppb or below, and performing thermal processing while feeding the purified nitrogen gas into the reaction furnace to form a capacitor dielectric film of a nitride film over the lower electrode; and
    a fifth step of forming an upper electrode over the capacitor dielectric film.

2. A capacitor fabrication method according to claim 1, wherein
    in the first step, the lower electrode of an impurity diffused layer is formed in the semiconductor substrate.

3. A capacitor fabrication method according to claim 2, further comprising, after the first step and before the second step,
    a sixth step of forming an oxide film on the lower electrode, and in which
    in the fourth step, the oxide film is nitrided to form the capacitor dielectric film of the nitride film.

4. A capacitor fabrication method according to claim 1, wherein
    in the first step, the lower electrode of a semiconductor layer with a dopant impurity implanted in is formed over the semiconductor substrate.

5. A capacitor fabrication method according to claim 4, which further comprises, after the first step and before the second step,
    a sixth step of forming an oxide film over the lower electrode, and in which
    in the fourth step, the oxide film is nitrided to form the capacitor dielectric film of the nitride film.

* * * * *